United States Patent
Qin et al.

[11] Patent Number: 6,020,625
[45] Date of Patent: *Feb. 1, 2000

[54] LEAD FRAME INCLUDING HANGING LEADS AND HANGING LEAD REINFORCEMENT IN A SEMICONDUCTOR DEVICE INCLUDING THE LEAD FRAME

[75] Inventors: Zhi-Kang Qin; Hiroshi Kawashimo; Yoshiharu Takahashi, all of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/162,788

[22] Filed: Sep. 30, 1998

[30] Foreign Application Priority Data

Mar. 27, 1998 [JP] Japan .................................. 10-081723

[51] Int. Cl.[7] .......................... H01L 23/50; H01L 23/48; H01L 23/28; H01L 23/495
[52] U.S. Cl. .......................... 257/666; 257/676; 257/696; 257/698; 257/669; 257/674; 257/670
[58] Field of Search .................................... 257/646, 672, 257/690, 669–674, 678, 698

[56] References Cited

U.S. PATENT DOCUMENTS

| | | |
|---|---|---|
| 5,283,466 | 2/1994 | Hayashi .................................. 257/670 |
| 5,291,060 | 3/1994 | Shimizu et al. ........................ 257/667 |
| 5,440,170 | 8/1995 | Tsuji et al. ............................. 257/666 |
| 5,637,913 | 6/1997 | Kajihara et al. ....................... 257/666 |
| 5,683,944 | 11/1997 | Joiner et al. ........................... 257/676 |
| 5,708,295 | 1/1998 | Oga et al. .............................. 257/666 |
| 5,726,490 | 3/1998 | Moroi ..................................... 257/666 |
| 5,789,806 | 8/1998 | Chua et al. ............................. 257/666 |
| 5,859,471 | 1/1999 | Kuraishi et al. ....................... 257/666 |
| 5,874,773 | 2/1999 | Terada et al. .......................... 257/676 |
| 5,910,681 | 6/1999 | Kozono .................................. 257/666 |

FOREIGN PATENT DOCUMENTS

| | | |
|---|---|---|
| 57-4226 | 1/1982 | Japan . |
| 63-66941 | 3/1988 | Japan . |
| 7202105 | 8/1995 | Japan . |
| 8236685 | 9/1996 | Japan . |

*Primary Examiner*—Alexander Oscar Williams
*Attorney, Agent, or Firm*—Leydig, Voit & Mayer, Ltd.

[57] ABSTRACT

A semiconductor device includes a lead frame including a die pad having corners, inner leads having respective inner end portions, outer leads, a hanging lead reinforcement, first hanging leads, and second hanging leads; a semiconductor chip bonded to the lead frame; and metal wires bonding the chip to the lead frame. A length of one side of the semiconductor chip is 2.5 mm smaller than a side of a molded resin external dimension, one side of the largest dimension of the hanging lead frame reinforcement not being longer than one side of the semiconductor chip. The die pad is sunk where second hanging leads are connected to the hanging lead reinforcement and has a step where connected to the second hanging leads. The camber of the external shape of the semiconductor device is reduced and a semiconductor device with high quality and reliability is obtained.

6 Claims, 22 Drawing Sheets

LEAD FRAME INCLUDING HANGING LEADS AND HANGING LEAD REINFORCEMENT IN A SEMICONDUCTOR DEVICE INCLUDING THE LEAD FRAME

BACKGROUND OF THE INVENTION

The present invention relates to a semiconductor device and a lead frame for a semiconductor device. More specifically the present invention relates to a semiconductor device having high quality and reliability, which is obtained by fixing and holding a semiconductor chip whose one side is 70% of the length of one side of the outside dimension of a molded resin, onto a lead frame, and by sealing the semiconductor chip with the resin, and relates to a lead frame used for the semiconductor device.

In a conventional semiconductor device, a dimension of a die pad of a lead frame is 0.2 to 0.4 mm larger than a size of a semiconductor chip in consideration of mounting accuracy onto a die pad of the device at the time of die-bonding of the semiconductor chip to the die pad. When the die pad is made of Cu-based material, there is a great difference between the coefficient of thermal expansion of the semiconductor chip $\alpha si = 3.5 \times 10^{-6}$ and the coefficient of thermal expansion of Cu $\alpha cu = 17 \times 10^{-6}$. For this reason, when the semiconductor chip is die-bonded to the die pad, a difference in a thermal stress is generated, and thus the semiconductor chip is cracked in the horizontal direction and a molded for package is cambered more than 100 $\mu$m due to heat distortion at the time of molding for package. Therefore, a residual thermal stress, such as soldering heat resistance, exists and the heat cycle characteristic is occasionally deteriorated. For this reason, the semiconductor chip having a dimension of up to 4 mm×4 mm has been normally mounted onto the die pad.

Accordingly, in order to solve the problem of thermal residual stress and to be able to mount a semiconductor chip having a dimension of not less than 4 mm×4 mm, the material for the die pad is changed to an Fe-based material having a coefficient of thermal expansion $\alpha fe$ of $5.5 \times 10^{-6}$. However, the heat radiation characteristic of the semiconductor device is determined by a material for the die pad, and in the case of a Fe-based die pad, Fe thermal conductivity $\gamma fe$ is as small as 0.0159 W/mm° C. compared to Cu thermal conductivity $\gamma cu$ of 0.0159 W/mm° C. Therefore, a value of permissible electric power consumption of the finished semiconductor device becomes small.

Meanwhile, for example, Japanese Unexamined Patent Publication No. Hei. 7-202105 and Japanese Unexamined Patent Publication No. Hei. 8-236685 disclose examples of the die pad. However, in these publications, (1) the dimension of a semiconductor chip is smaller than an outer dimension of the die pad, (2) the dimension of the semiconductor chip is smaller than the outer dimension of reinforcement, (3) a small semiconductor chip whose dimension is 30% of dimension of the mold for package is stored in the mold, and the dimension of the semiconductor chip is equal to or smaller than a dimension from the outer size of the semiconductor chip to the outer size of the mold, (4) a gap between the die pad and the reinforcement is approximately equal to a difference between the dimensions of the semiconductor chip and die pad, and a width of the reinforcement is approximately equal to the gap between the die pad and reinforcement, (5) a material for the die pad is not described, (6) there is no description that a sunk amount of a Cu-based die pad should be larger than a sunk amount of a Fe-based die pad, and (7) there is no description about a relationship between rigidity of a die pad hanging lead and a dimension of the die pad. For this reason, phenomena which occur in an assembly procedure of the semiconductor device, such as a chip camber which occurs due to die-bonding, a change in a sunk amount of a frame due to the chip camber, a change in a sunk amount of the frame after wire bonding, and all phenomena which occur due to unbalance of resin fluidity at the time of molding, cannot be dealt with, so that a proportion of the dimension of the semiconductor chip stored in the mold cannot be made to be larger.

In future, when the function of the semiconductor chip is improved and the number of pins is increased, the volume of the semiconductor chip with respect to the volume of resin sealing becomes larger. At the same time, volumes of the die pad, die pad hanging leads and inner leads become larger.

For this reason, when the semiconductor chip is die-bonded to the die pad, the die pad is bent due to joining of materials with different coefficients of thermal expansion, and thus a dam bar and a lead frame are deformed via a hanging lead for supporting die pad. For example, when the rigidity of the hanging lead is closer to the rigidity of the lead frame, the lead frame is influenced by bending of the die pad, and thus the lead frame is deformed. For this reason, a dimension of a pitch of a transporting perforation provided in the frame in the assembly procedure of the semiconductor device is affected, and thus improper frame transportation into a wire-bonding device occurs.

On the contrary, when the rigidity of the hanging lead is very much smaller than the rigidity of the lead frame, the effect of the die pad bending on the lead frame is decreased, and thus the lead frame is not deformed. However, when a metal mold is removed after the lead is wire-bonded by pressing it using the metal mold in the wire bond procedure, there arises a problem that a lift-up amount of the semiconductor chip becomes larger due to a tension of a metallic wire. Moreover, in the case where the semiconductor chip is sealed by molten resin using a metal mold in the molding procedure, there arises a problem that when the molten resin is poured into the metal mold, an amount of shifting the die pad in the up-and-down direction becomes larger due to flowing pressure of the molten resin.

When a proportion of the volume of a semiconductor chip to the volume of resin sealing becomes larger, an effect of the aforementioned phenomena becomes remarkable, and in some cases, production of semiconductor devices becomes difficult. If such a semiconductor device is produced, the device is cambered greatly, and the device does not satisfy the standard of evenness of the lead. For this reason, there arise problems in that the yield is lowered, and resistance to solder and heat, resistance to heat cycling, resistance to cracking and resistance to release are not satisfactory.

In view of the above circumstances, it is an object of the present invention to provide a semiconductor device with high quality and reliability, and a lead frame used for the semiconductor device, in which (1) camber is reduced and die pad shifting is reduced at the time of die-bonding, (2) die pad shifting at the time of wire-bonding is reduced, and (3) die pad shifting at the time of molding is reduced, and thus the proportion of the volume of a semiconductor chip to the volume of sealing resin becomes larger.

SUMMARY OF THE INVENTION

In accordance with a first aspect of the present invention, there is provided a semiconductor device comprising:
   a lead frame composed of a die pad having plural corners;
      plural inner leads which are arranged at prescribed intervals along an circumferential edge of the die pad and have an inner end portion; outer lead extending from an outer side of the inner leads; a hanging lead reinforcement which is arranged in a frame shape between the die pad and inner leads along the circumferential edge of the die pad; a first hanging lead for connecting the corners of the die pad with the hanging lead reinforcement; and a second hanging lead for connecting the hanging lead reinforcement with a dam bar between the inner leads and outer leads, a semiconductor chip bonded to the lead frame through a die bond, and a metallic wire for electrically connecting the semiconductor chip with the plural inner leads, wherein the lead frame, semiconductor chip and metallic wire are packaged with a mold resin, and the end portion of the outer leads of the lead frame, the dam bar, and the end portions of the second hanging lead at an outer portion of the vicinity of the mold boundary connected with the dam bar are cut, and wherein a length of one side of the semiconductor chip is 2.5 mm smaller than one side of a mold external diameter, one side of the most external circumference of the hanging lead reinforcement formed in a frame shape is not more than the length of one side of the semiconductor chip, one side of the die pad exceeds 3 mm and is not more than 50% of the length of the one side of the most external circumference of the hanging lead reinforcement formed in the frame shape, the die pad is sunk in the vicinity where the second hanging lead for connecting the hanging lead reinforcement with the dam bar is connected with the hanging lead reinforcement, and a step is provided to the second hanging lead.

In accordance with a second aspect of the present invention, there is provided a lead frame for semiconductor device comprising:

a die pad having plural corners; plural inner leads having inner end portion in which a center point of a semiconductor chip imaginarily stored coincides with a center point of the die pad and which are arranged at prescribed intervals along an circumferential edge of the semiconductor chip with keeping a necessary gap therefrom; a dam bar formed on an external extended portion of the inner leads; plural outer leads extended from the dam bar whose ends are connected to a rail portion of the frame; a hanging lead reinforcement arranged in a frame shape along a circumferential edge of the die pad with a distance larger than the dimension of the die pad; a first hanging lead for connecting the corners of the die pad with the hanging lead reinforcement, and a second hanging lead for connecting the hanging lead reinforcement with the dam bar, wherein the die pad is sunk in the vicinity where the second hanging lead is connected with the hanging lead reinforcement, and a step is provided to the second hanging lead.

In accordance with a third aspect of the present invention, there is provided a lead frame for semiconductor device comprising:

a die pad having plural corners; plural inner leads having inner end portion in which a center point of a semiconductor chip imaginarily stored coincides with a center point of the die pad and which are arranged at prescribed intervals along an circumferential edge of the semiconductor chip with keeping a necessary gap therefrom; a dam bar formed on an external extended portion of the inner leads; plural outer leads extended from the dam bar whose ends are connected to a rail portion of the frame; a hanging lead reinforcement arranged in a frame shape along a circumferential edge of the die pad with a distance larger than the dimension of the die pad; a first hanging lead for connecting the corners of the die pad with the hanging lead reinforcement; and a second hanging lead for connecting the hanging lead reinforcement with the dam bar, wherein the first hanging lead has a width larger than a width of the second hanging lead, the die pad is sunk in the vicinity where the second hanging lead is connected with the hanging lead reinforcement, and a step, which is at least ½ of the value obtained by subtracting a thickness dimension of the semiconductor chip, a thickness dimension of the die bond and a thickness dimension of the die pad from a thickness dimension of the mold, is provided to the second hanging lead.

In accordance with a fourth aspect of the present invention, there is provided a lead frame for semiconductor device comprising:

a die pad having plural corners; plural inner leads having inner end portion in which a center point of a semiconductor chip imaginarily stored coincides with a center point of the die pad and which are arranged at prescribed intervals along an circumferential edge of the semiconductor chip with keeping a necessary gap therefrom; a dam bar formed on an external extended portion of the inner leads; plural outer leads extended from the dam bar whose ends are connected to a rail portion of the frame; a hanging lead reinforcement arranged in a frame shape along a circumferential edge of the die pad with separation, distance larger than the dimension of the die pad; a first hanging lead for connecting the corners of the die pad with the hanging lead reinforcement; and a second hanging lead for connecting the hanging lead reinforcement with the dam bar, wherein the first hanging lead has a width larger than a width of the second hanging lead, the die pad is sunk in the vicinity where the second hanging lead is connected with the hanging lead reinforcement, and a step is provided to the second hanging lead.

In accordance with a fifth aspect of the present invention, there is a provided a semiconductor device comprising:

a lead frame composed of a die pad having plural corners; plural inner leads which are arranged at prescribed intervals along an circumferential edge of the die pad and have an inner end portion; outer lead extending from an outer side of the inner leads; a hanging lead reinforcement which is arranged in a frame form between the die pad and inner leads along the circumferential edge of the die pad; a first hanging lead for connecting the corners of the die pad with the hanging lead reinforcement; and a second hanging lead for connecting the hanging lead reinforcement with a dam bar between the inner leads and outer leads, a semiconductor chip bonded to the lead frame through a die bond, and a metallic wire for electrically connecting the semiconductor chip with the plural inner leads, wherein the lead frame, semiconductor chip and metallic wire are packaged with a mold resin, and the end portion of the outer leads of the lead frame, the dam bar, and the end portions of the second hanging lead at an outer portion of the vicinity of the mold boundary connected with the dam bar are cut, and wherein the first hanging lead has a width larger than a width of the second hanging lead, the die pad is sunk in the vicinity where the second hanging lead is connected with the hanging lead reinforcement, and a step, which is at least ½ of a value obtained by subtracting a thickness dimension of the semiconductor chip, a thickness dimension of the die bond and a thickness dimension of the die pad from a thickness dimension of the mold, is provided to the second hanging lead.

In accordance with a sixth aspect of the present invention, there is provided a semiconductor device comprising:

a lead frame composed of a die pad having plural corners; plural inner leads which are arranged at prescribed intervals along an circumferential edge of the die pad and have an inner end portion; outer lead extending from an outer side of the inner leads; a hanging lead reinforcement which is arranged in a frame form between the die pad and inner leads along the circumferential edge of the die pad; a first hanging lead for connecting the corners of the die pad with the hanging lead reinforcement; and a second hanging lead for connecting the hanging lead reinforcement with a dam bar between the inner leads and outer leads, a semiconductor chip bonded to the lead frame through a die bond, and a metallic wire for electrically connecting the semiconductor chip with the plural inner leads, wherein the lead frame, semiconductor chip and metallic wire are packaged with a mold resin, and the end portion of the outer leads of the lead frame, the dam bar, and the end portions of the second hanging lead at an outer portion of the vicinity of the mold boundary connected with the dam bar are cut, and wherein the first hanging lead has a width larger than a width of the second hanging lead, the die pad is sunk in the vicinity where the second hanging lead is connected with the hanging lead reinforcement, and a step is provided to the second hanging lead.

DETAILED DESCRIPTION

The semiconductor device and lead frame for semiconductor device of the present invention will be explained hereinafter based on the accompanying drawings.

Figure 1:
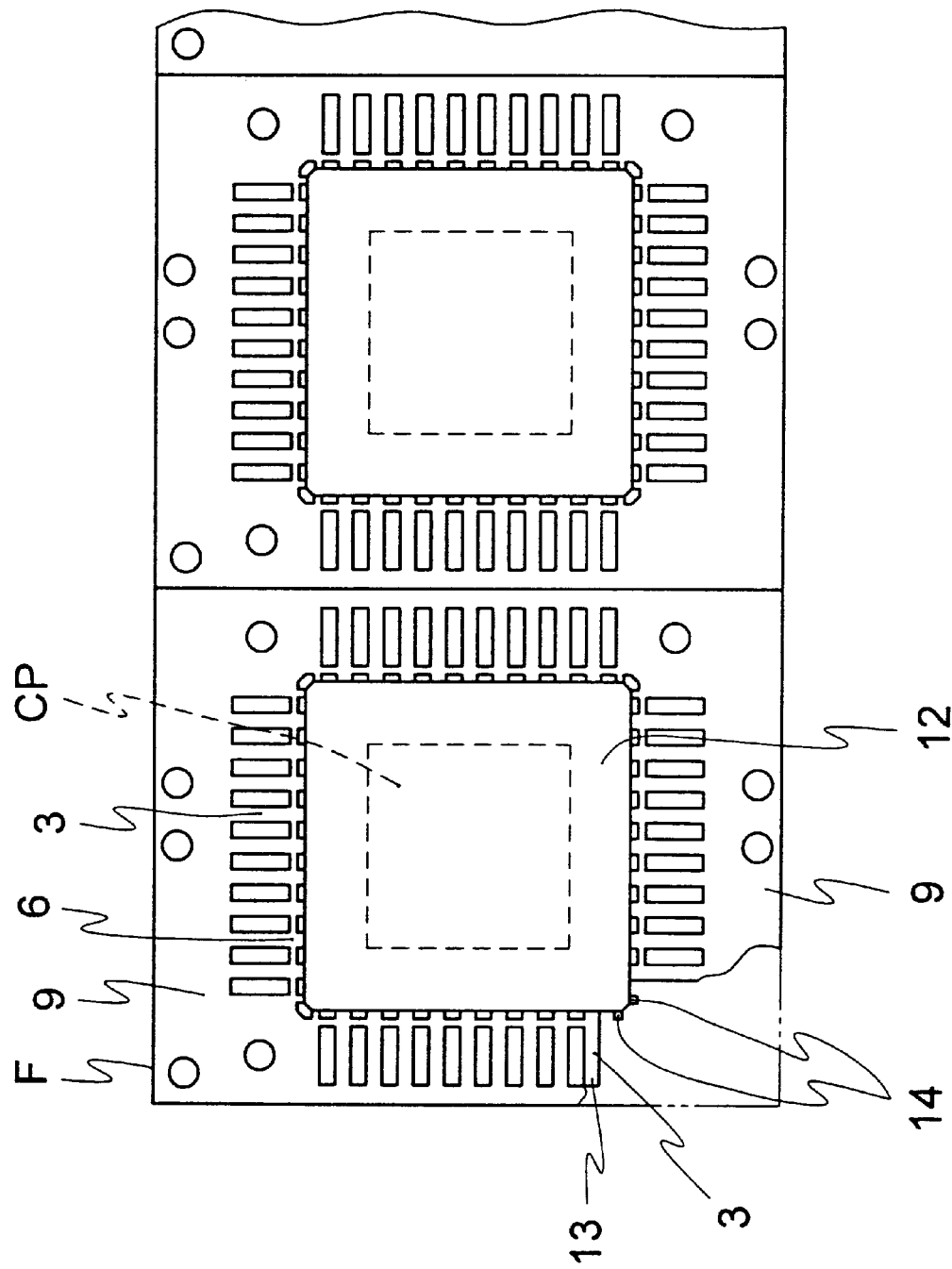
FIG. 1 is a partially cut-away plan view illustrating a molded state of a lead frame for a semiconductor device according to one embodiment of the present invention.
Figure 2:
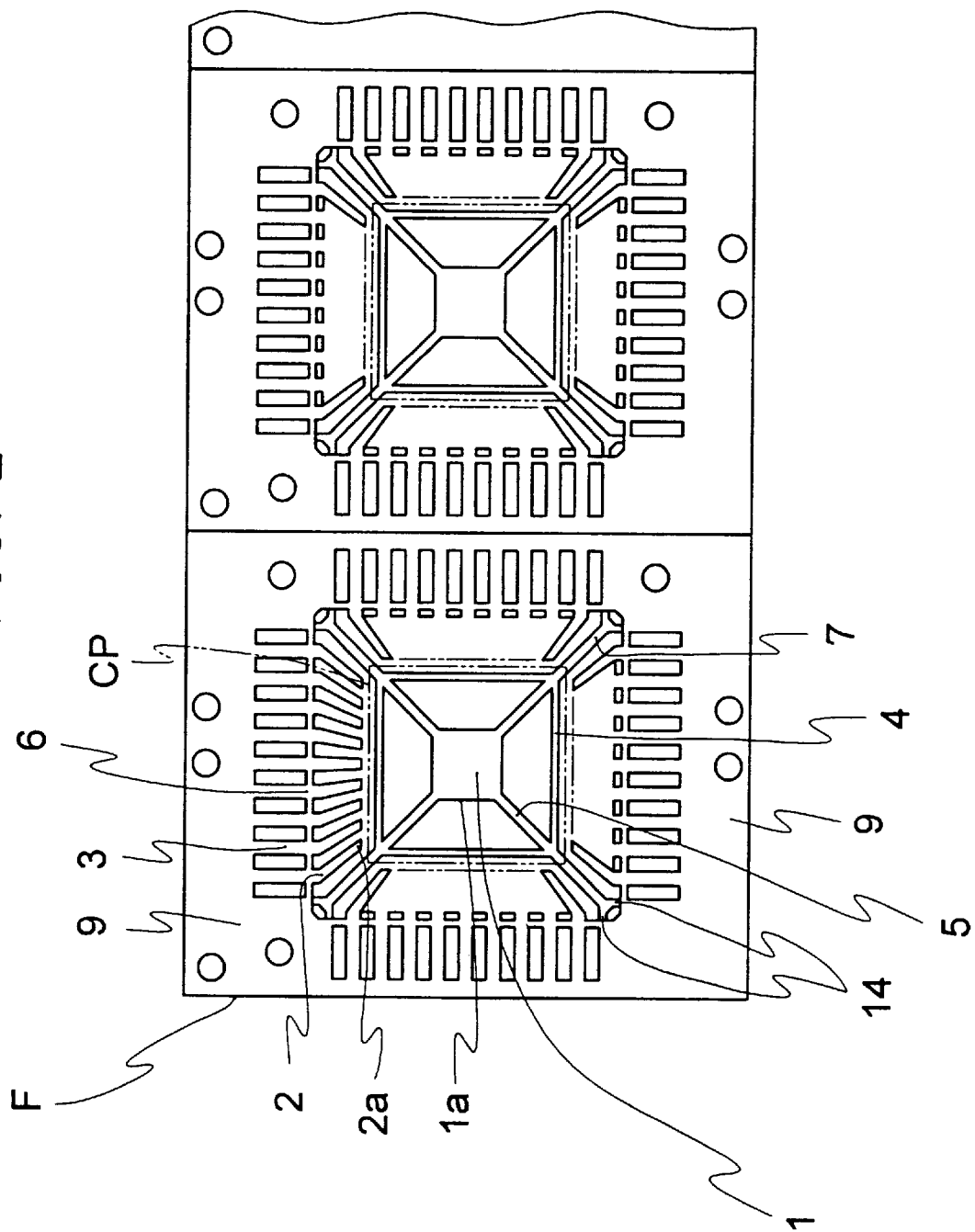
FIG. 2 is a plan view of the lead frame for the semiconductor device according to one embodiment of the present invention.
Figure 3:
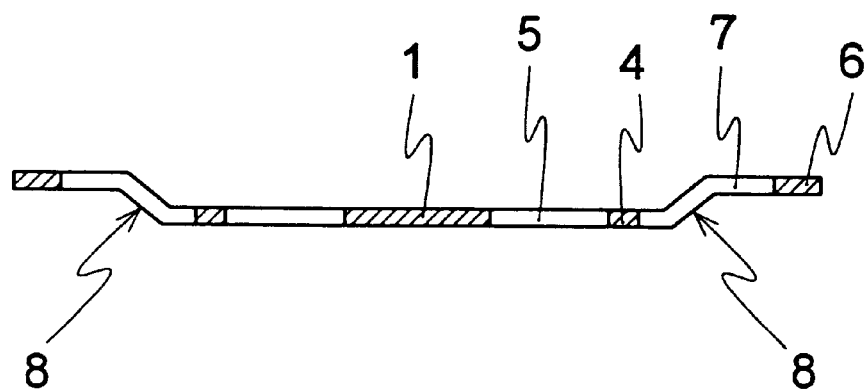
FIG. 3 is a sectional view showing a main portion of the lead frame of FIG. 2.

FIG. 1 shows the state where semiconductor chips are mounted in a single row in a die pad and resin molding is finished in the present embodiment. In a part of the drawing, a portion where a dam bar and external lead are cut is shown. The drawing also shows one example of a relationship between an outer dimension of the molded resin and a dimension of the semiconductor chip. FIG. 2 shows one example of a relationship between the dimensions of the die pad, a frame-shaped hanging lead reinforcement, a first hanging lead, a second hanging lead and the semiconductor chip in the present embodiment where the molded resin of the FIG. 1 is omitted. FIG. 3 is a sectional view showing a main portion of the lead frame.

As shown in FIGS. 1 through 3, a lead frame F according to one embodiment of the present invention is composed of a die pad 1 having plural corners; plural inner leads 2 which are arranged at prescribed intervals along a circumferential edge 1a of the die pad 1 and which have an inner end portion 2a; outer leads 3 which are provided in an outer side of the inner leads 2; a hanging lead reinforcement 4 which is arranged in a frame shape between the die pad 1 and inner lead 2 along the circumferential edge 1a of the die pad 1; a first hanging lead 5 for connecting the corners of the die pad 1 with the hanging lead reinforcement 4; and a second hanging lead 7 for connecting the hanging lead reinforcement 4 with a dam bar 6 between the inner leads 2 and outer leads 3. The die pad is sunk by bending in the vicinity where the second hanging lead 7 is connected with the hanging lead reinforcement 4, and a step 8 is provided to the second hanging lead 7. A frame rail section 9 is located at an outer circumference of the outer leads 3. Moreover, the inner end portions 2a of the inner leads 2 come to a position such that the inner leads 2 are arranged at prescribed intervals along the circumferential edge of the semiconductor chip CP leaving a necessary gap from the semiconductor chip CP with a center point of the semiconductor chip CP coinciding with a center point of the die pad 1.

A package camber phenomenon which occurs after molding or the like has has close relationship with rigidity of the hanging lead, a length or area of bonding between the die pad and the semiconductor chip, and a die pad sunk dimension. As mentioned in Japanese Unexamined Patent Publication No. Hei. 7-202105 and Japanese Unexamined Patent Publication No. Hei. 8-230685 when a length or area of bonding between the die pad and semiconductor chip is simply decreased, the length of the hanging lead of the die pad becomes longer. As the result, rigidity of the hanging lead of the die pad is lowered, and a shifting of the die pad in the up-and-down direction becomes larger because of a force in the up-and-down direction applied to the die pad and semiconductor chip due to a difference in fluidity between molten resin flowing on the semiconductor chip and below the die pad at the time of pouring of the mold resin. Therefore, means for reducing a length or area of bonding between the die pad and semiconductor chip so as to reduce camber of the die pad and a change in the die pad sunk distance after die bonding, which occur due to a difference in coefficients of thermal expansion between the semiconductor chip and die pad, is contrary to reducing length of the die pad hanging lead and increasing the rigidity of the die pad handing lead. These measures reduce the shifting of a die pad sunk distance due to the force in the up-and-down direction which is generated from a difference in flow speed of the molten resin. Therefore, there arises a problem of the arrangements of the die pad and its hanging lead.

The means for simply reducing a bonding length of the die pad and semiconductor chip has been known not only in Japanese Unexamined Patent Publication No. Hei. 7-202105 and Japanese Unexamined Patent Publication No. Hei 8-236685 but also in Japanese Unexamined Utility Model Publication No. Sho. 57-4226. There arises a problem of how to lower the rigidity of the hanging lead which is caused by a long length of the hanging lead Means which solve this problem relates to an arrangement of the hanging lead reinforcement of the die pad in the present invention.

In Japanese Unexamined Patent Publication No. Hei. 7-202105 and Japanese Unexamined Patent Publication No. Hei. 8-236685 a beam, which is very similar to the hanging lead reinforcement of the die pad of the present invention, is provided to the vicinity of the die pad, but this arrangement does not reinforce the hanging lead but only reinforces the die pad. This is the same means as disclosed in Japanese Patent Application No. Sho. 61-212090 and Japanese Unexamined Patent Publication No. Sho. 63-249341 but in these structures, unlike the present invention, a large semiconductor chip is not mounted on a die pad, so that the camber cannot be reduced and shift of the die pad cannot be suppressed. Therefore, a low-priced semiconductor device with high reliability and quality, in which the semiconductor chip has a satisfactory heat radiation characteristic, package camber is reduced and a thermal residual stress is minimized, cannot be obtained.

Therefore, the lead frame of the present invention is composed of the die pad 1 which is comparatively smaller than the semiconductor chip CP, the hanging lead reinforcement 4 of the die pad is 1 provided in a position sufficiently separated from the die pad 1 so that it does not affect the die pad 1, the first hanging lead 5 for connecting the die pad 1 with the hanging lead reinforcement 4, and the second hanging lead 7 for connecting the hanging lead reinforcement 4 with the dam bar 6.

Figure 4:
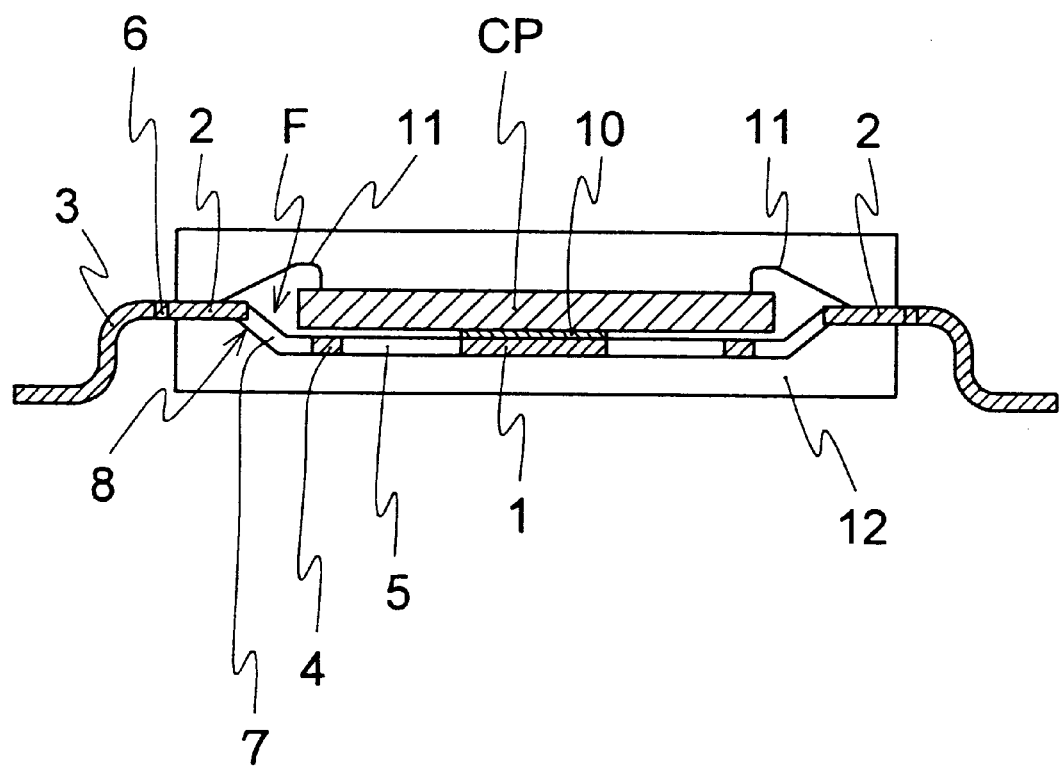
FIG. 4 is a sectional view showing the semiconductor device using the lead frame of FIG. 2.

As shown in FIG. 4, in the semiconductor device according to one embodiment of the present invention, a metallic wire 11, which electrically connects the semiconductor chip CP mounted on the lead frame F via a die bond material 10 with the plural inner leads 2, is packaged with a molded resin 12, and an outer lead end portion 13 (see FIG. 1) of the lead frame F, a dam bar 6 and a second hanging lead end portion 14 (see FIG. 1) in the outer portion of the vicinity of the mold boundary connected with the dam bar 6 are disconnected. The semiconductor chip CP, in which at least one side is larger than an outer dimension of the mold, is die-bonded to the die pad 1 having the frame-shaped hanging lead reinforcement 4 in a copper frame having a coefficient of thermal expansion of $\alpha cu = 17 \times 10^{-6}$, and thereafter, they are molded. At this time, the camber due to heat distortion caused in the semiconductor device is reduced. For this reason, the heat radiation characteristic is improved, and the thermal residual stress is lowered, so that the semiconductor device, which has satisfactory heat resistance, such as resistance to heat cycling and resistance to heat shock, can be obtained.

The following describes functions for adjusting the camber and shift of the die pad which are achieved by a dimension of the die pad, the first hanging lead, second hanging lead and hanging lead reinforcement.

First, thermal residual distortion and thermal stress are generated because the die pad, die bond material, semiconductor chip and mold material having different coefficients of thermal expansion are joined together in a layer form; the semiconductor chip, hanging lead and mold material are joined together in a layer form; and the inner leads and mold material are joined together in a layer form. Namely, thermal stresses such as compressive stress and tensile stress σj are generated in the portions which are arranged by joining the members together in a layer form, and the compressive stress and tensile stress σj are generated in the respective members j because of balance of mechanical forces so that the relationship $\Sigma Wj \times Tj \times \sigma j = 0$ (Wj and Tj represent a width and thickness of the members j, respectively) is satisfied. However, internal stored energy U in the semiconductor device due to the thermal stress is represented as $U = \Sigma Ej \times \epsilon j^2 \times Wj \times Tj \times Lj/2$ (Ej is longitudinal elastic modulus of the members j) or $U = \Sigma \sigma j^2 \times Wj \times Tj \times Lj/(2 \times Ej)$, and the value does not become zero. Accordingly, when the internal stored energy is reduced, there can be obtained a semiconductor device in which the heat radiation characteristic is excellent, the thermal residual stress is low and heat resistance, such as resistance to heat cycling and resistance to heat shock, is excellent. Thus, among the function of the sinkings provided to the first hanging lead, second hanging lead, hanging lead reinforcement and die pad, the following describes the function of the sinkings provided to the second hanging lead, hanging lead reinforcement, die pad and second hanging lead.

Figure 5:
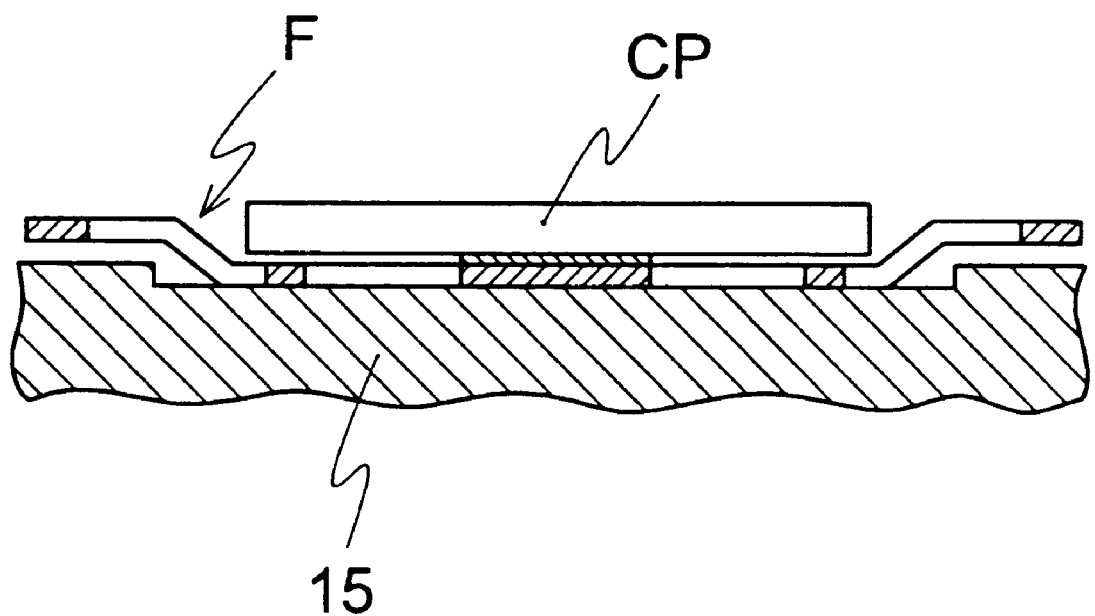
FIG. 5 is a view showing a state in which a semiconductor chip is die-bonded to the lead frame of FIG. 3.
Figure 6:
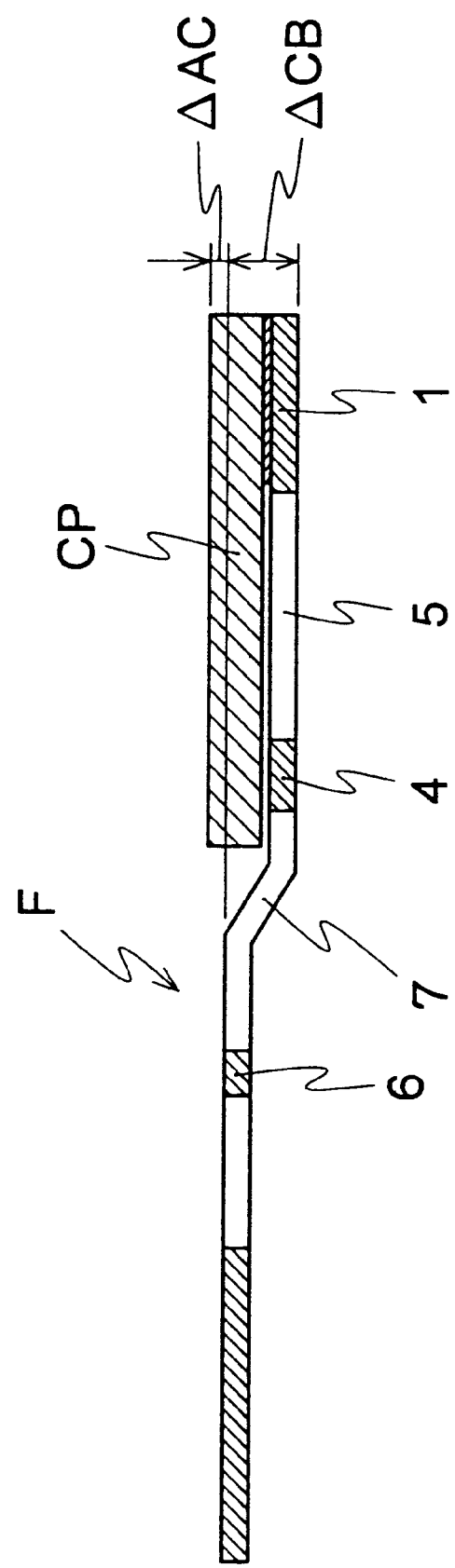
FIG. 6 is a view showing an ideal state of the present invention in which a die pad is sunk without deformation before molding.
Figure 7:
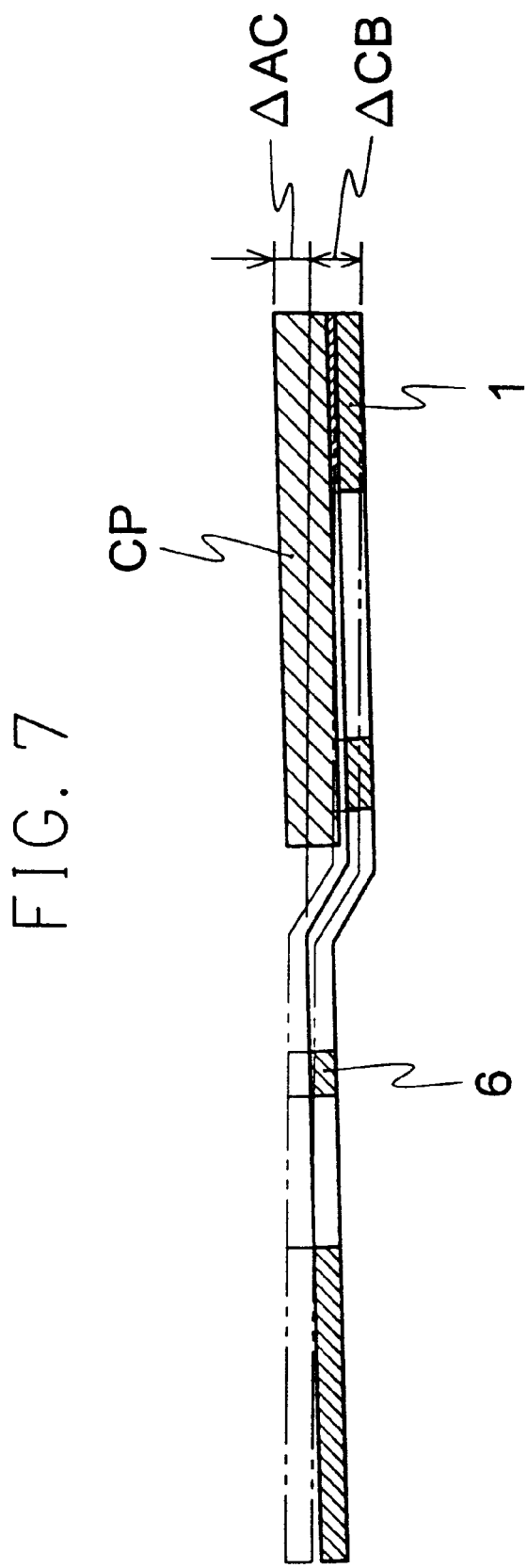
FIG. 7 is a view showing a change in die pad sunk amount.

FIG. 5 shows a state in which the semiconductor chip is die-bonded to the lead frame in FIG. 3. FIG. 6 shows the dimensional relationship between the die pad 1, frame-shaped hanging lead reinforcement 4, first hanging lead 5, second hanging lead 7 and semiconductor chip CP in an ideal state in which heat deformation does not occur at the time of die-bonding. FIG. 7 shows an exaggerated change in a die pad sunk amount with the die pad 1 and semiconductor chip 1 being cambered when the temperature is lowered to room temperature after a heat history of die bonding and die-bond curing at about 230° C.

Figure 8:
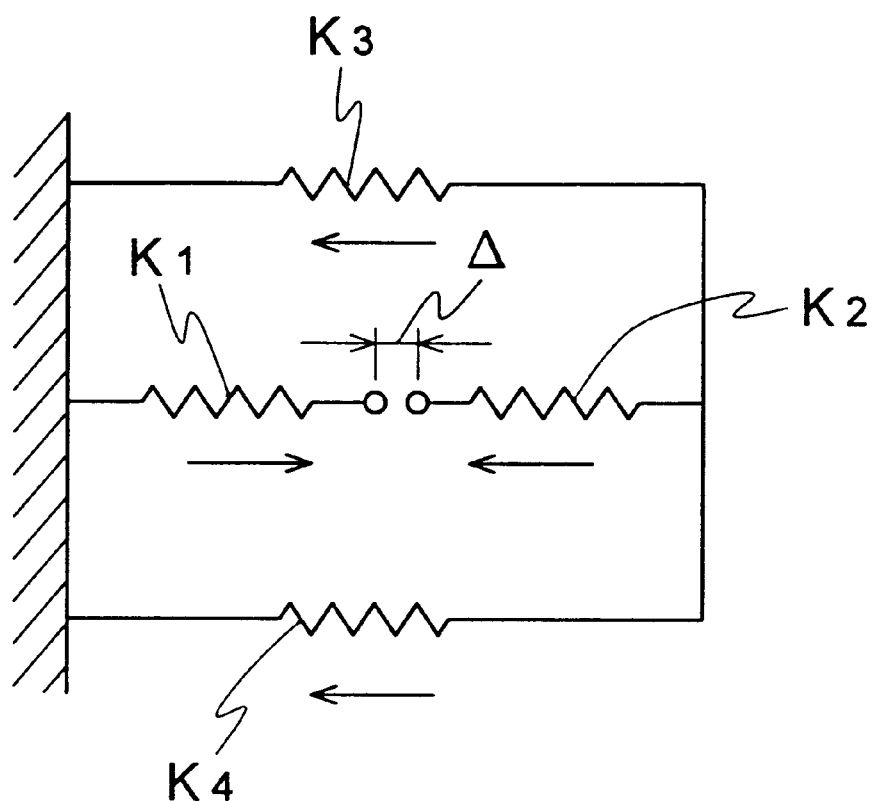
FIG. 8 is a model view showing that an equivalent spring constant of the die pad portion is combined with a composite equivalent spring constant of each portion of the lead frame for the semiconductor device.

As shown in FIG. 5, when the semiconductor chip CP is die-bonded to the lead frame F shown in FIG. 2 mounted on a heat block 15, the state shown in FIG. 6 is maintained at a high temperature, just after the die-bonding. However, when the temperature is lowered to room temperature, as shown in FIG. 7, a die pad sunk dimension $\Delta CB$ at the center point of the die pad 1 becomes smaller than a die pad sunk dimension $\Delta CB$ at the center point of the die pad 1 shown in FIG. 6. On the contrary, as shown in FIG. 7, a dimension $\Delta AC$ from the dam bar 6 to the surface of the semiconductor chip CP at the center point of the die pad 1 becomes larger than a dimension $\Delta AC$ from the dam bar 6 to the surface of the semiconductor chip CP at the center point of the die pad 1 shown in FIG. 6. This phenomenon is described in FIG. 8. FIG. 8 shows a spring coupled model in which a center line of the semiconductor chip CP is an axis of symmetry for deformation, and K1 represents an equivalent spring constant after the semiconductor chip is die-bonded to the die pad, K2 represents an equivalent spring constant of the first and second hanging leads, K3 represents an equivalent spring constant including the upper-side dam bar, frame rail section and outer lead in FIG. 2, and K4 represents an equivalent spring constant including the lower-side dam bar, frame and outer lead in FIG. 2. Since this model is based on a lead frame having a uniform coefficient of thermal expansion, except for K1 portion, free thermal expansion and thermal shrinkage occur after die-bonding. However, since the semiconductor chip is joined together in the K1 portion by die-bonding, only this portion has a different composite equivalent coefficient of thermal expansion. For this reason, when the die-bonding temperature which is high is lowered to room temperature, a difference $\Delta$ corresponding to the product of a difference in the coefficient of thermal expansion and a difference in temperature occurs in the connected portion between K1 and K2 shown in FIG. 8. Because of the balance of force, the following equation is satisfied.

$$K1 \times \Delta 1 = K2 \times \Delta 2 + K3 \times \Delta 3 + K4 \times \Delta 4$$

This represents the fact that the displacement corresponding to the product of a difference in coefficient of thermal expansion and a difference in temperature caused by the die pad and semiconductor chip is affected mostly by a displacement $\Delta 2$ in the equivalent spring constant K2, a displacement $\Delta 3$ in the equivalent spring constant K3 and a displacement $\Delta 4$ in the equivalent spring constant K4. The composite equivalent spring constant K1 of the die pad and semiconductor chip is generally 2 to 3 time the other spring constants K2, K3 and K4.

The important point in this case is that the displacement is absorbed greatest by the displacement $\Delta 2$ of the equivalent spring constant K2 of the hanging leads. Since $\Delta 3$ and $\Delta 4$ function as displacements of the frame rail section, $\Delta 3$ and $\Delta 4$ should be as small as possible. When $\Delta 3$ and $\Delta 4$ become larger, an error occurs in a perforation pitch because the perforation for transportation is provided in the frame rail section. As a result, in a transportation system of a wire-bonding device and a molding device, there is caused an impossibility of transportation or a transportation jam, and thus producibility is deteriorated extremely.

Figure 9:
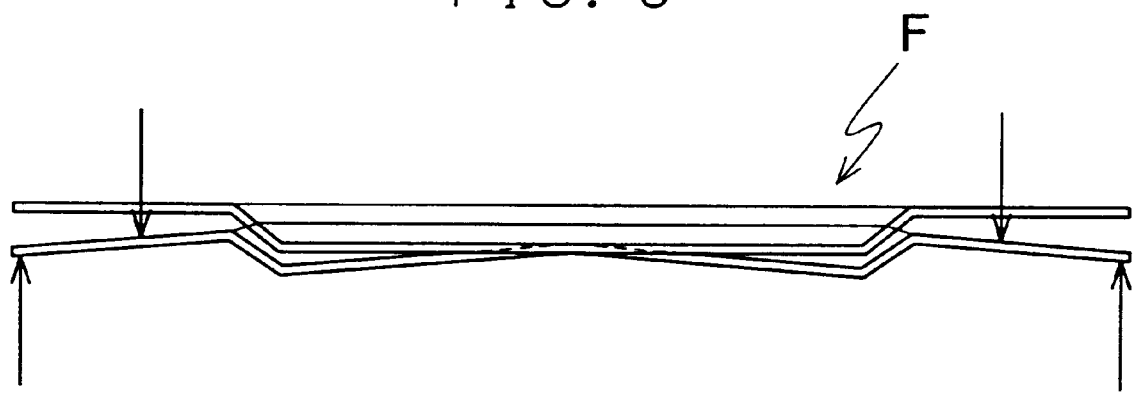
FIG. 9 is a view showing a changing state of the lead frame for the semiconductor device after die-bonding and wire-bonding.
Figure 10:
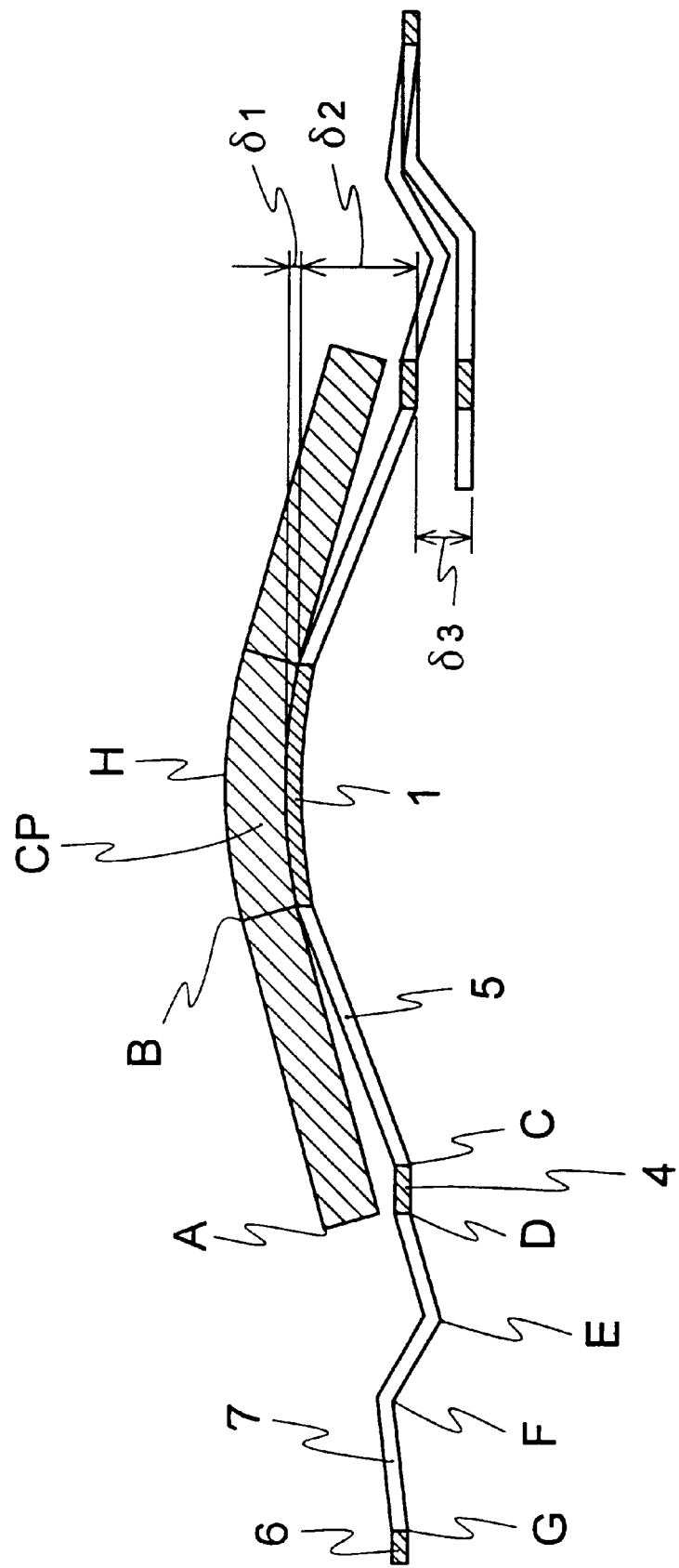
FIG. 10 is a view showing a state just before the lead frame for semiconductor device is set in a metal mold and clamped.

The following describes a phenomenon in which a simple tension force (hereinafter, referred to as tension force) and bending moment, which are caused when the semiconductor chip is die-bonded to the die pad and they are joined together, causes die pad shift via the hanging lead, and describes how the first hanging lead, hanging lead reinforcement, second hanging lead and bending of the second hanging lead effect a reduction in the above phenomenon. As mentioned above, the arrangement is made in such a manner that deformation which occurs in the hanging lead portion is absorbed by the deforming amount $\Delta 2$ of the equivalent spring constant K2 of the hanging lead, so that $\Delta 3$ and $\Delta 4$ become small, and that $\Delta 2$ becomes largest. Namely, this deformation is performed as shown in FIG. 9. In this drawing, the semiconductor chip is omitted. FIG. 10 shows a model of the bending. In the drawing, bending moment M and tension force F are generated in the portion B-H where the semiconductor chip CP is joined to the die pad 1 by die-bonding. The bending moment M and tension force F are transmitted to the first hanging lead 5, hanging lead reinforcement 4, second hanging lead 7 and dam bar 6, to generate displacement according to the rigidity of the respective members.

Next, the following describes action of the bent portion in the vicinity of the hanging lead reinforcement 4 provided to the second hanging lead.

Figure 11:
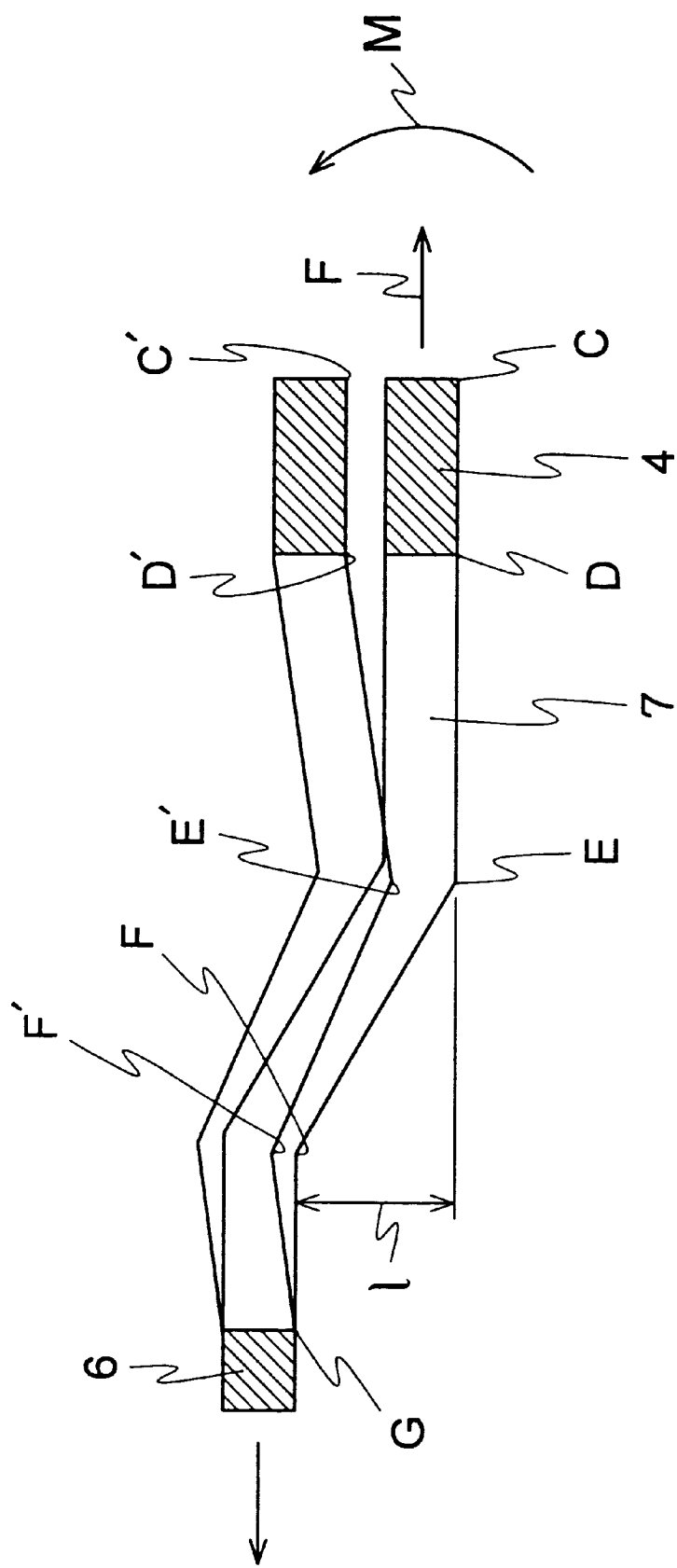
FIG. 11 is a view for explaining deformation of a second hanging lead.
Figure 12:
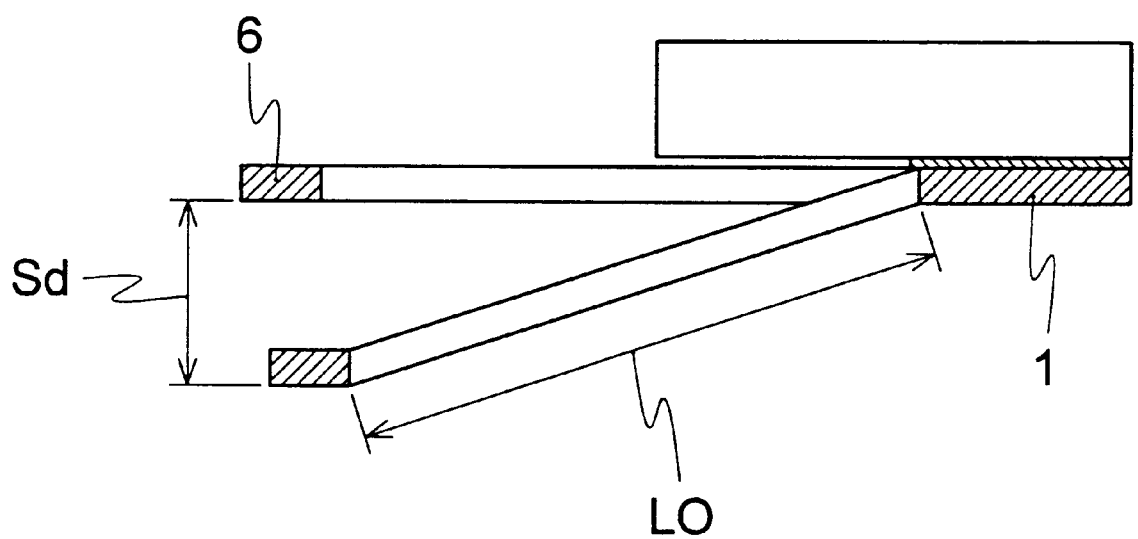
FIG. 12 is a view showing a die pad shift in the case where a conventional lead frame for semiconductor device does not have a frame-shaped hanging lead reinforcement.
Figure 13A:
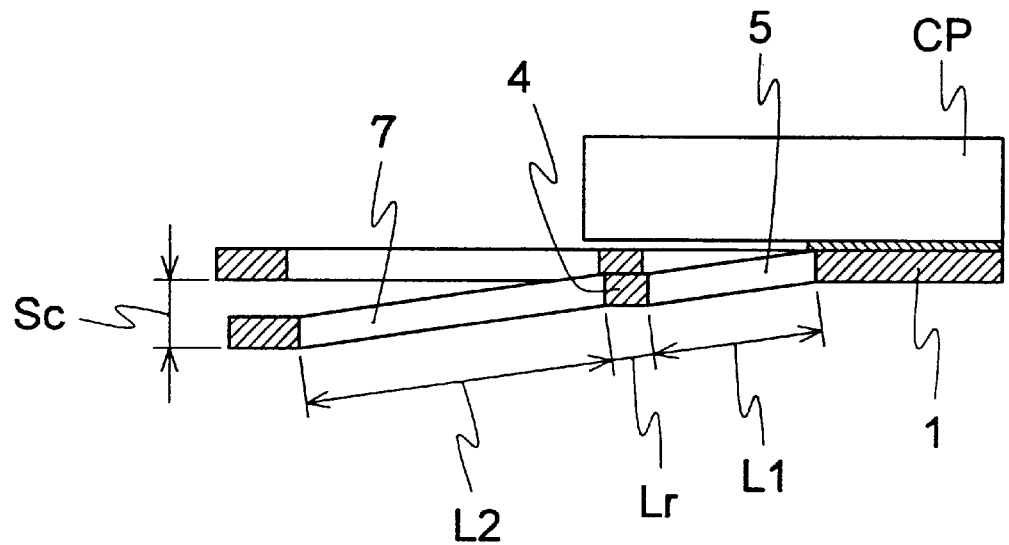
FIG. 13 is an explanatory view showing a positional relationship between the hanging lead reinforcement and die pad.

In FIG. 11, a bent portion is provided for die pad sinking in the vicinity of the hanging lead reinforcement 4 of the second hanging lead 7, and this portion is enlarged for explanation. Here, the first hanging lead, die pad, etc. are omitted. Moreover, as for a displacement of B-C-D-E-F-G in FIG. 10, an enlarged example of displacement of respective members when the point B of the die pad 1 and the point G of the dam bar 6 are joined by a single hanging lead is shown in FIG. 12. FIG. 13(a) shows an example in which the hanging lead reinforcement 4 is provided at a position which divides equally the length of the hanging lead shown in FIG. 12. Here, the die pad sinking is omitted.

First, in FIG. 11, when the moment M and tension force F are applied to the hanging lead reinforcement 4 via the first hanging lead as shown in the drawing, G-F-E representing the state before deformation becomes G-F'-E'. When the tension force F acts, the die pad connected to the second hanging lead 7 extends G-F-E-D, and the moment of (die pad sunk amount 1)×F acts thereupon so that an angle G-F-E increases and an angle F-E-D narrows. The sunk die pad connected to the second hanging lead 7 in FIG. 11 changes the tension force F into the moment of (die pad sunk amount 1)×F.

When the rigidity is increased so that the angles G-F-E and F-E-D are not changed, an amount of displacement from the point C to C' becomes larger. For this reason, a reduction in the rigidity of the second hanging lead 7 and the bent portion, whose angle is changed in the vicinity of the hanging lead reinforcement 4 connected to the second hanging lead 7 reduces the shift distance.

On the contrary, in the case where a sunk die pad sunk is not provided, when the tension force F acts upon the linear hanging lead before the deformation shown in FIG. 12, for example, the displacement occurs only in the direction of extension, the rigidity against the tension force F is strong. For this reason, the displacement in FIG. 12 can occur only in a changing direction of the sunk die pad. As a result, a change Sd is made, and thus the die pad shift distances becomes large.

The following describes practical application of the arrangement of the die pad 1, first hanging lead 5, second hanging lead 7 and frame-shaped hanging lead reinforcement 4.

In FIG. 2, for describing the actions of the first hanging lead 5, second hanging lead 7, die pad 1 and hanging lead reinforcement 4, portions other than the portion necessary for explanation are omitted, and the dimension of the die pad 1 is not more than ½ of the dimension of the semiconductor chip CP.

As mentioned above, if the greatest amount of displacement is not absorbed by the displacement Δ2 of the equivalent spring constant K2, allotment to Δ3 and Δ4 should be increased. Since Δ3 and Δ4 are displacement of the frame rail section, and the perforation for transportation is located in the frame, an error occurs in the perforation pitch, and in the transportation system of the wire-bonding device and molded device, transportation is impossible and there is a jam, whereby the productivity is deteriorated extremely.

With respect to tension force and bending moment, which are generated in order to join the semiconductor chip to the die pad together by die-bonding, as mentioned before in the model of FIG. 8, deformation which occurs in the hanging lead portion causes the greatest amount of displacement in the equivalent spring constant K2 of the hanging lead. As shown in FIG. 10, this deformation causes the bending moment M and tension force F in the portion B-H where the semiconductor chip CP is joined to the die pad 1 by die-bonding. The bending moment M and tension force F are transmitted to the first hanging lead 5, hanging lead reinforcement 4, second hanging lead 7 and dam bar 6, and displacement occurs according to the rigidity of the respective member portions.

Figure 14:
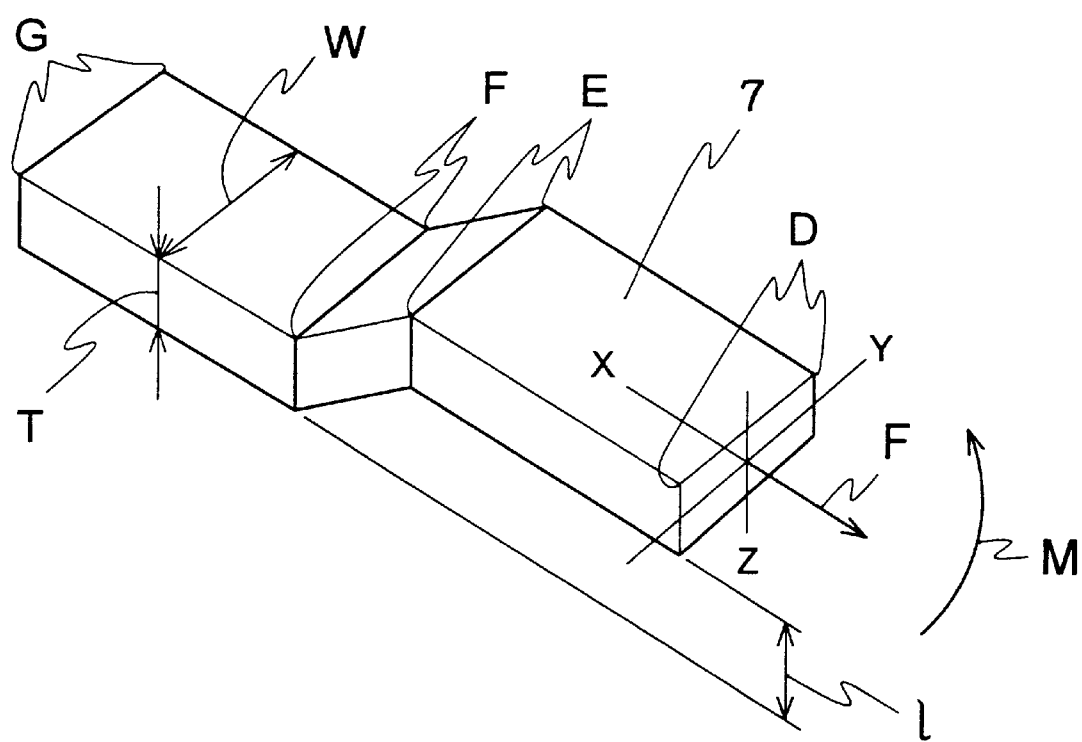
FIG. 14 is a perspective view explaining a second hanging lead.

The explanation for the first hanging lead 5 having a simple beam form is omitted, and FIG. 11 shows deformation when the moment M and tension force F are applied to the second hanging lead 7. FIG. 14 shows a state in which the moment M and tension force F are applied to an area where the second hanging lead 7 is sunk. It is necessary that the hanging lead is so designed as to be deformed desirably. To put it in an extreme way, the rigidity of the hanging lead should be suppressed. According to the present embodiment in which die pad is sunk in the vicinity of the hanging lead reinforcement 4 of the first hanging lead 5, when the tension force F is applied, the angle of D-E-F and the angle of E-F-G are changed by the moment M' (sunk amount 1×F).

As shown in FIG. 14, deformation rigidity in the direction X against the tension force F is represented by $Kfx=W \times T \times E/L$. Here, W is a width, T is a thickness, E is a longitudinal elastic modulus and L is a length. On the contrary, rigidity against bending deformation is represented by $Km=C \times W \times T^3 \times E/L^3$. Here, C is a constant which varies with the supporting conditions of both ends.

It is necessary to obtain a plastic package storing a semiconductor chip of large dimension to arrange Kfx and Km in order to relieve thermal deformation or thermal stress. Further, from the above, there is obtained the equation $Kfx/Km=L^2/(C \times T^2)$. In the present embodiment, the die pad 1, semiconductor chip CP, first hanging lead 5, hanging lead reinforcement 4 and second hanging lead 7 are arranged so that the deformation rigidity Kfx acts against the displacement in the direction where the deformation is desired to be suppressed, and the bending deformation rigidity Km positively acts against the displacement in the direction where the deformation is not desired to be suppressed.

$\delta 1$ in FIG. 10 is a displacement due to the camber of the die pad 1, $\delta 2$ is a displacement of the first hanging lead 5, and $\delta 3$ is a displacement of the second hanging lead 7. When a die bond joint length B-H between the semiconductor chip CP and die pad 1 are shortened, $\delta 1$ can be decreased, and the value of the bending moment M due to thermal deformation can be also decreased. The displacement amount $\delta 2$ of the first hanging lead 5 can be decreased by shortening a distance Lc-b of C-B and by widening the width W. The displacement amount $\delta 3$ of the second hanging lead 7 can be decreased by shortening a length of the second hanging lead 7 between the hanging lead reinforcement 4 and the dam bar 6. According to the present embodiment, the second hanging lead 7 is bent at a portion connected with the hanging lead reinforcement 4 so that the die pad is sunk, and as a result, the length of the second hanging lead 7 becomes longer. This is because the thermal deformation is centered at this portion, and, after molding, the vicinity of the mold outer periphery which connects the second hanging lead 7 at the dam bar 6, is separated, so that constraint of the connected portion where residual thermal internal stress and residual thermal internal deformation occur is released.

In the second hanging lead 7 of the present embodiment, the thermal deformation is absorbed positively. Referring to FIGS. 10 and 14, a description is given as to a method of intentionally controlling the deformation direction of the second hanging lead 7 so that it faces towards the direction Z in the drawings. The second hanging lead is formed so that its width W and thickness T satisfy the relationship W>T. In FIG. 13, the polar moment of area with respect to the Y axis is represented by $1y=W \times T^3/12$, and the polar moment of area with respect to the Z axis is represented by $1z=T \times W^3/12$. As is clear from this, since the bending rigidity in the Z-axial direction is stronger by $(W/T)^2$ than the bending rigidity in the Y-axial direction, the displacement is controlled by the weaker bending rigidity in the Y-axial direction, and thus the displacement occurs in the Z-axial direction which is at right angles to the Y-axial direction.

The die pad sunk amount varies depending on the position in which the hanging lead reinforcement 4 is provided. The following describes a result according to a position of a gap between the die pad 1 and dam bar 6 on which the hanging lead reinforcement 4 is arranged.

Figure 15:
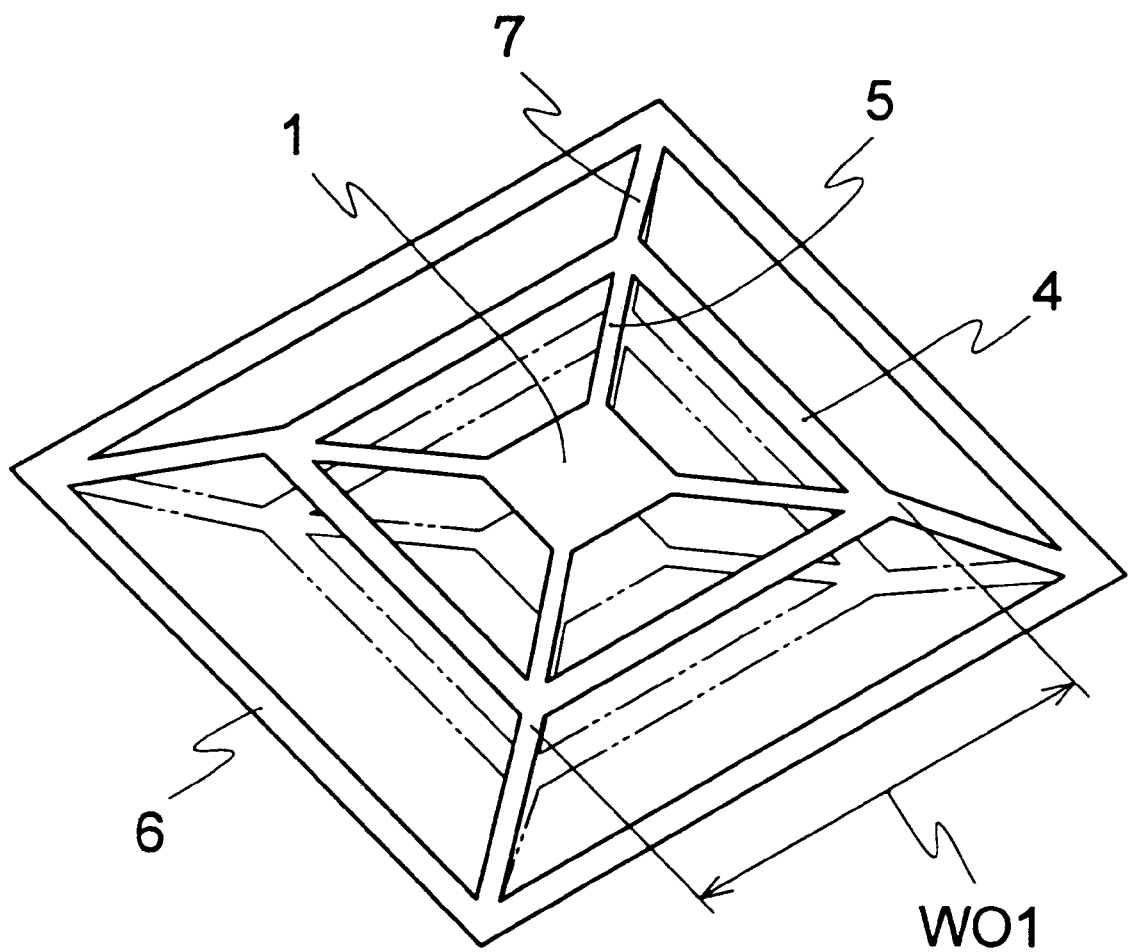
FIG. 15 is a view showing a relationship of dimensions on the basis of a dam bar when the die pad and hanging lead shift.

FIG. 12 shows a deformation amount Sd of one hanging lead in which a connected length between the die pad 1 and dam bar 6 is L0. In this case, as shown in FIGS. 13(*a*) and 13(*b*), the relationship L0=L1+L2+Lr, in which L1 is a length of the first hanging lead 5 to which the hanging lead reinforcement 4 is provided, L2 is a length of the second hanging lead 7 and Lr is a length of the hanging lead reinforcement 4, is satisfied. Moreover, as shown in FIG. 15, the dimension in the widthwise direction of the hanging lead reinforcement 4 with the length Lr, where two hanging lead reinforcements 4, the first hanging lead 5 and the second hanging lead 7, intersect, is very larger than the width of the first hanging lead 5 with length L1 and the second hanging lead 7 with length L2. Thus, the rigidity of this portion is strong, and thus the displacement in this portion can be eliminated. For this reason, as for a deformation amount Sd of the hanging lead 5 with a length L0 with respect to the moment and tension force based on thermal residual stress acting upon the die pad after die bonding, the relationship that L0>L1+L2 and Sd>Sc>Sb is satisfied. As a result, when the width of the hanging lead reinforcement 4 is widened to eliminate extreme displacement, the hanging lead reinforcement 4 is sealed into the mold, and thus a lot of thermal residual stress after molding remains in the semiconductor device. Accordingly, resistance to heat cycling and resistance to cracking are deteriorated. For this reason, volumes of the semiconductor chip, die pad, hanging leads, hanging lead reinforcement and inner leads occupying the mold volume have optimum values. Moreover, in the conventional way, the optimum values of length, thickness and width of the semiconductor chip, die pad, hanging lead, inner lead and mold material are obtained in order to maintain resistance to heat cycling and resistance to cracking, but in the present embodiment, the optimum values of the length, thickness and width of the hanging lead reinforcement are also obtained.

Figure 13B:
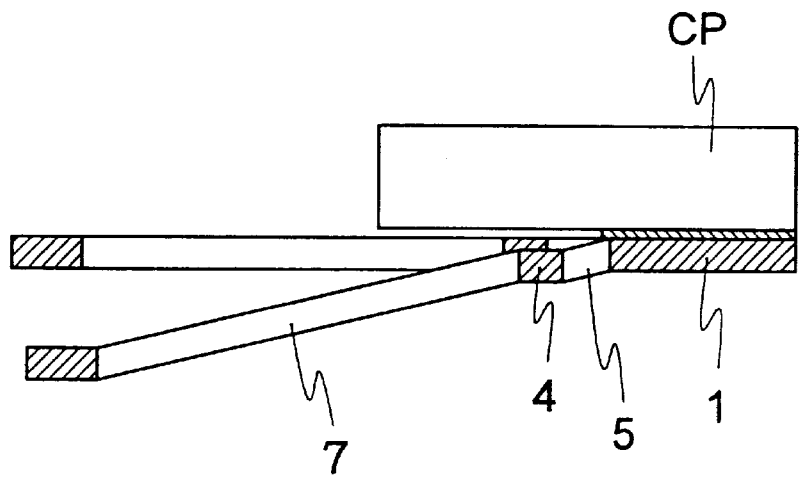

Meanwhile, FIG. 13(b) shows a difference in function according to variation of the position to which the hanging lead reinforcement 4 shown in FIGS. 13(a) and 13(b) is provided. In FIG. 13(b), when the hanging lead reinforcement 4 is provided to the vicinity of the die pad 1, the hanging lead reinforcement 4 reinforces the first hanging lead 5 and die pad 1 simultaneously, so that camber at the time of die-bonding of the semiconductor chip CP to the die pad 1, which is small cannot be reduced. Since the second hanging lead 7 which should be reinforced cannot be reinforced much, L0 shown in FIG. 12 is shortened only to be L2 shown in FIG. 13(a).

Accordingly, the hanging lead reinforcement 4 is provided in a position separated from the die pad 1 so as not to reinforce the die pad 1, and it is provided in a position which is as close as possible to the most external circumference of the semiconductor chip CP. As a result, the die pad shift can be reduced.

In FIG. 4, when molding is performed so that the dimension from the surface of the semiconductor chip CP to the upper-external surface of the mold becomes equal to the dimension from the rear surface of the semiconductor chip CP to the lower-external surface of the mold, die pad shift does not occur at the time of molding. However, in the semiconductor device which is molded in such a manner, its camber does not always become zero.

Namely, the dimension from the upper surface of the semiconductor chip CP to the upper-external surface of the mold, and the dimension from the rear surface of the semiconductor chip to the lower-external surface of the mold for making the camber of the package after molding zero are changed by a combination of the dimensions of the semiconductor chip CP, material of the die pad 1, dimension of the die pad 1, dimension and material of the frame-shaped hanging lead reinforcement 4, and dimension and material of the die bond material 10. For example, in the semiconductor device shown in FIG. 4, in the case where the copper frame which is formed with the square die pad having one side of 4 mm in which the molded resin external shape dimension is 24 mm and, the thickness is 1.4 mm, the dimension from the upper surface of the semiconductor chip (thickness: 0.45 mm) to the upper-external surface of the mold is 0.568 mm, and the dimension from the rear surface of the semiconductor chip to the lower-external surface of the mold is 0.382 mm for obtaining the minimum camber at the time of molding. On the contrary, in the case of using a copper frame, the dimension from the upper surface of the semiconductor chip CP to the upper-external surface of the mold is 0.531 mm, and the dimension from the rear surface of the semiconductor chip CP to the lower-external surface of the mold is 0.419 mm, for obtaining the minimum camber at the time of molding. At the time of molding, the dimension is changed with respect to 0.475 ((1.4–0.45)/2) mm without die pad shift. Therefore, it is necessary for reducing the difference to change the dimension of one side of the die pad 1 and to determine the optimum dimension.

In the producing process of the semiconductor device, since die pad shift occurs in the frame in the die-bonding process and it is increased by the wire in the wire-bonding process. The die pad sunk dimension at the time of putting the frame into the producing process is required to be deeper by an amount provided for shifting than the die pad sunk amount just before the molding process.

Figure 16:
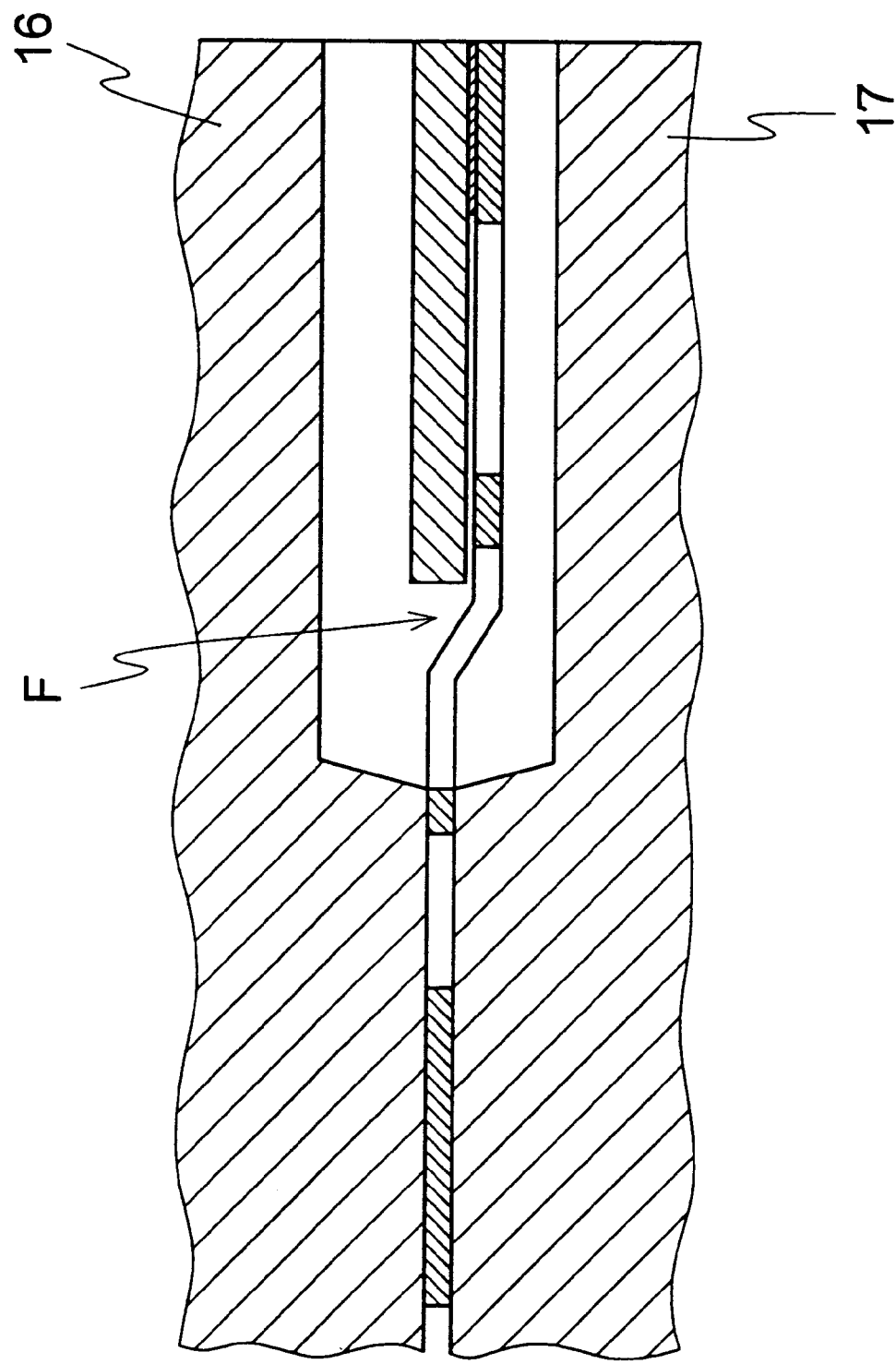
FIG. 16 is a view showing a state in which the undeformed lead frame for a semiconductor device is clamped in a metal mold.

For this reason, when the die pad sunk amount in the producing process is 1.5 times deeper than the plate thickness of the lead frame, die pad shift does not occur at the time of molding, and the camber of the package can be as close as possible to zero after the semiconductor device is molded, FIG. 16 shows a state which the lead frame F is mounted on an upper metal mold 16 and lower metal mold 17 without thermal deformation.

Figure 17:
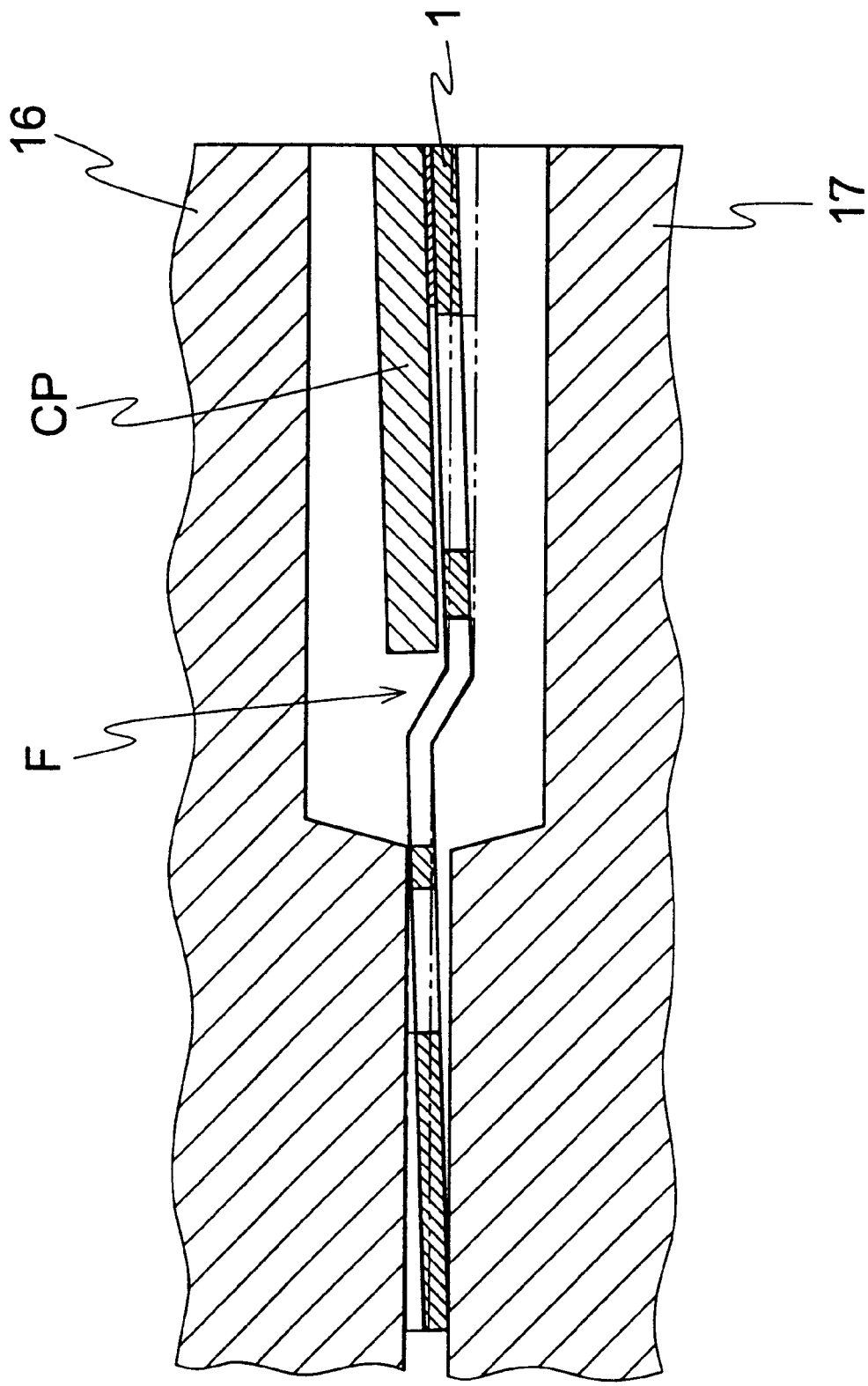
FIG. 17 is a view showing a state just before the deformed lead frame for a semiconductor device is set in the metal mold and clamped.

FIG. 17 shows a difference in dimensions of the gap inside the metal mold for explaining imbalance between a gap dimension from the surface of the semiconductor chip CP to the upper metal mold 16, a gap dimension from the die pad 1 to the lower metal mold 17 and a gap dimension from the rear surface of the semiconductor chip CP to the lower metal mold on which the lead frame F in which thermal deformation occurs as shown in FIG. 7 is mounted.

Figure 18:
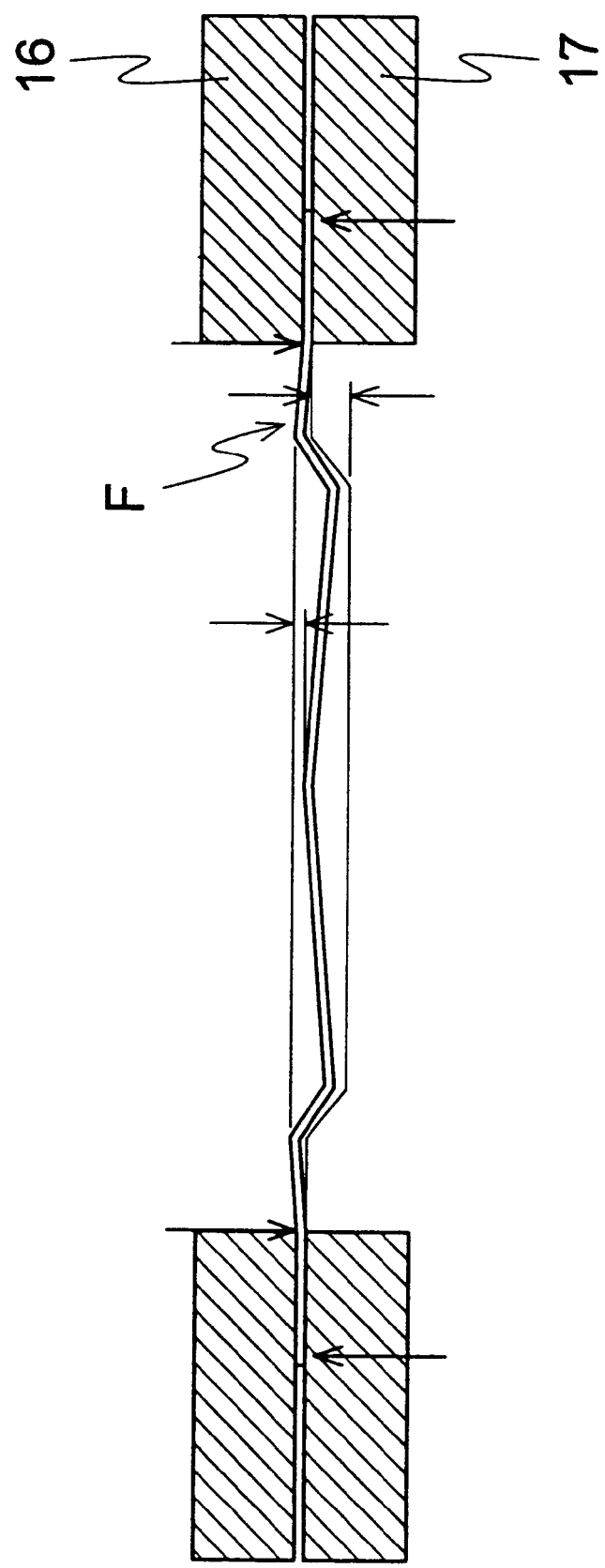
FIG. 18 is a view showing deformation of the second hanging lead, hanging lead reinforcement, first hanging lead and die pad after the lead frame is clamped in the metal mold.

FIG. 18 shows only lead frame F with thermal deformation as shown in FIG. 7 by omitting the semiconductor chip. As for forced displacement, there is caused thermal deformation due to the difference between the equivalent coefficient of thermal expansion of the die-bonded portion after the die pad is die-bonded to the semiconductor chip and the coefficient of thermal expansion of the lead frame surrounding the die pad. FIG. 18 shows a state just before a molten resin is poured, after the lead frame shown in FIG. 10 is put into the metal mold, from a position of FIG. 17 with no space remaining. The position where the die pad is sunk in this state determines camber of the semiconductor device after molding. Moreover, FIG. 18 shows that when the molding is performed by using the frame F with thermal deformation, the weight of the metal mold is placed on the dam bar portion of the frame clamped by the upper and lower metal molds and the lead frame end portion, and thus a bending stress is applied to the die pad portion and hanging lead portion by the metal mold.

The following describes the present invention based on examples, but the present invention is not limited to these examples.

EXAMPLE 1

Figure 19:
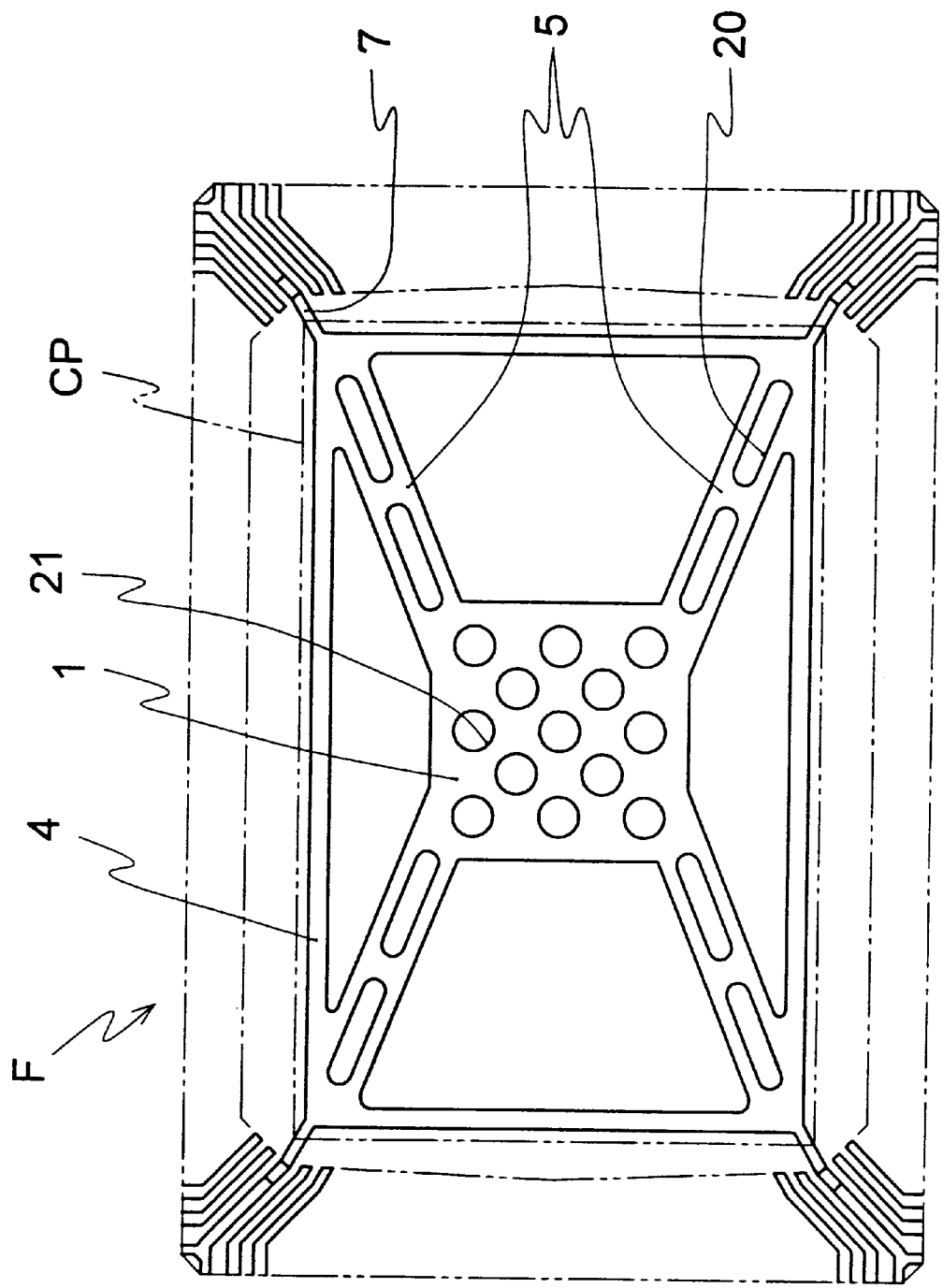
FIG. 19 is a plan view showing a main portion of the lead frame for a semiconductor device according to Embodiments 1 and 2.

As shown in FIG. 19, the second hanging lead 7 is arranged so that a width W2 is 0.2 mm, a plate thickness T2 is 0.125 mm and a length L2 is 3.658 mm, and the die pad is sunk so that a step of 0.3 mm is formed in the connected position with the frame-shaped hanging lead reinforcement 4. Moreover, the frame-shaped hanging lead reinforcement 4 is formed in a frame shape so that a width Wr is 0.4 mm, and an external dimension has 14 mm×9 mm. The first hanging lead 5 is a width W1 is 1 mm and a thickness T1 of 0.125 mm, and connects the die pad 1 with the hanging lead reinforcement 4. Two slots 20 of width of 0.4 mm are formed on the center line of the first hanging lead 5 with width W1 of 1 mm. The dimension of the semiconductor chip CP is 14.2 mm×10 mm, and the external dimension of the molded resin is 20 mm×14 mm×1.4 mm. The die pad 1 has a square shape in which one side is 5 mm, and thirteen through holes 21 of 0.8 mm are included at a pitch of 0.8 mm. The two slots 20 are formed, but their number can be one or not less than three. Moreover, the number of the through holes 21 is not limited to thirteen, so its number can be selected suitably, and instead of the through holes 21 shown, cross-shaped through holes can be used.

Figure 20:
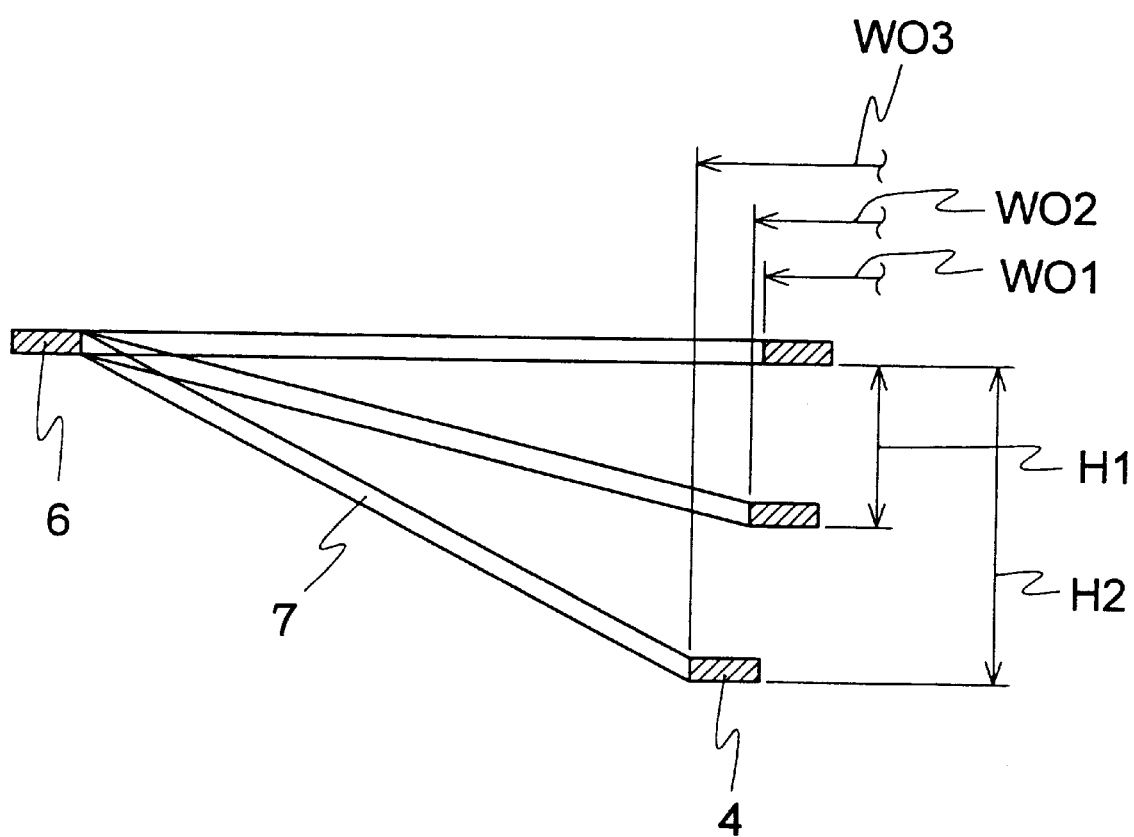
FIG. 20 is an explanatory view showing a relationship between the hanging lead reinforcement and die pad shift.

FIG. 15 is an enlarged view of the hanging lead reinforcement 4, first hanging lead 5, dam bar 6 and second hanging lead 7 shown in FIG. 2. When the die pad 1 is shifted downward, for example, (in FIG. 15, turned upside down), the length of the first hanging lead 5 is extended, and as shown in FIGS. 15 and 20, when the shift of the die pad 1 is H1, an outer circumferential dimension WO1 of the hanging lead reinforcement 4 is extended to WO2, and when the shift of the die pad 1 is H2, the outer circumferential dimension is extended to WO3. The displacement from WO1 to WO2 is resisited by the rigidity against displacement due to the tension load of the hanging lead reinforcement 4. Since one end of the first hanging lead 5 is connected with the die pad 1, and the other end is connected with hanging lead reinforcement 4, a boundary condition of both ends can be considered to be fixed ends with respect to the displacement in the direction Z which is at right angles to the surface of the die pad 1. As mentioned above, the hanging lead reinforcement 4 has tension load rigidity, and the boundary condition in which both ends of the first hanging lead 5 has strong bending rigidity against the bending moment.

The hanging lead reinforcement 4 is provided around the die pad 1 with, keeping a prescribed distance therefrom, and it is effective in the present example, that the hanging lead reinforcement 4 is located in the vicinity of a middle point of a distance between the die pad 1 and dam bar 6. In general, when the number of pins is increased, the width of the first hanging lead 5 becomes narrower, but in the present example, as shown in FIG. 19, in the case where the second hanging lead 7 and first hanging lead 5 have different lengths and widths, the thin and short second hanging lead 7 and wide and long first hanging lead 5 are included. As a result, the most satisfactory effect on the die pad shift can be obtained.

FIGS. 15 and 20 shows one example for explaining the case where the die pad shifts downward, but in the case where the die pad shifts upward, the same effect is obtained. However, when the die pad shifts downward, the condition is more satisfactorily than the case where the die pad shifts upward. This is because, since the semiconductor chip CP is larger than the external circumferential dimension of the hanging lead reinforcement 4, in the case where the displacement H1 of the first hanging lead 5 is large, the semiconductor chip CP is brought into contact with hanging lead reinforcement 4, and the hanging lead reinforcement 4 limits the displacement H1 of the hanging lead.

Accordingly, the die pad sunk amount after wire-bonding and before molding can be set in such a manner that the die pad shifts downward in response to the flow of the molten resin. In the case of a thin package such as TQFP and TSOP, in which the thickness of the molded external shape is 1 mm, the die pad can be formed in a position where it does not shift at the time of molten resin flow.

The semiconductor chip CP shown in FIG. 19, in which a length of one side is 70% of a length of one side of the molded external shape, is die-bonded to the die pad 1 by a resin die bond material 10, and respective electrodes of the semiconductor chip are connected with corresponding inner end portions 2a of the inner leads 2 by a bonding wire. Next, after the lead frame to which the semiconductor chip CP is fixed is mounted on the metal mold, a molten molding resin is poured in the mold to seal the chip. As a result, a semiconductor device having high quality and reliability is obtained.

The lead frame F having the arrangement shown in FIG. 19 is used in the semiconductor device whose body size is 14 mm×20 mm and molded external shape is rectangular, and in the semiconductor device whose body size is from 12 mm×12 mm to 24 mm×24 mm and molded external shape is square, and satisfactory results could be obtained in both devices. In particular, the package camber, moisture absorption cracking resistance and frame strength can be improved greatly.

Figure 21:
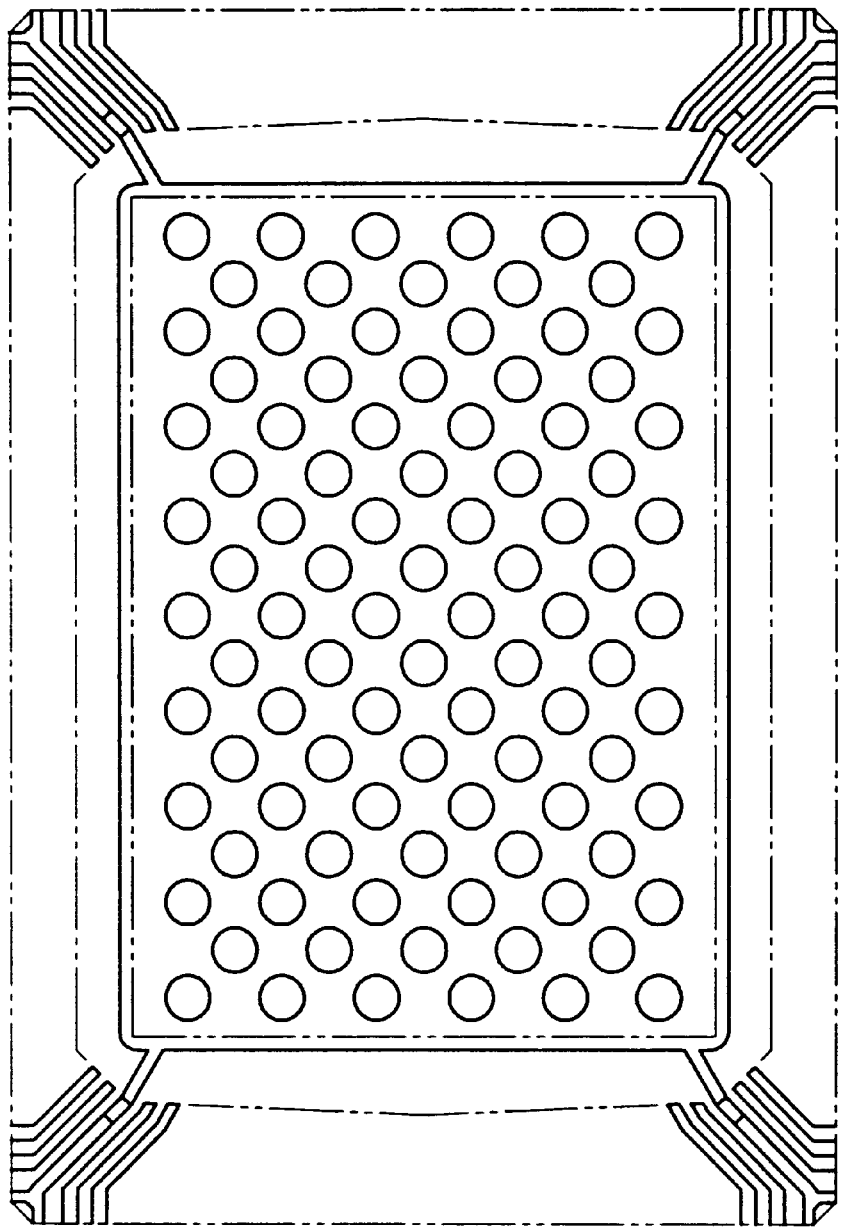
FIG. 21 is a plan view showing the die pad and hanging lead in the conventional lead frame for a semiconductor device.

The package camber: in the semiconductor device in which the semiconductor chip CP is mounted on the frame having a die pad shown in FIG. 19, the camber can be reduced to 40 μm compared with the conventional semiconductor device with a camber of 80 μm in which the semiconductor chip is mounted on the frame F1 having a large die pad shown in FIG. 21. Here, in the conventional semiconductor device in which the semiconductor chip is mounted on the frame F2 having a die pad shown in FIG. 22 without having reinforcement, the chip is exposed at the time of molding.

The moisture absorption crack resistance: in the semiconductor device in which the semiconductor chip is mounted on the frame F1 having a conventional die pad shown in FIG. 21, the moisture absorption cracking resistance is 30° C./70% R.H. 96 hours, but in the semiconductor device in which the semiconductor chip is mounted on the frame having a die pad shown in FIG. 19, the moisture absorption crack resistance is 30° C. /70% R.H. 336 hours.

Figure 22:
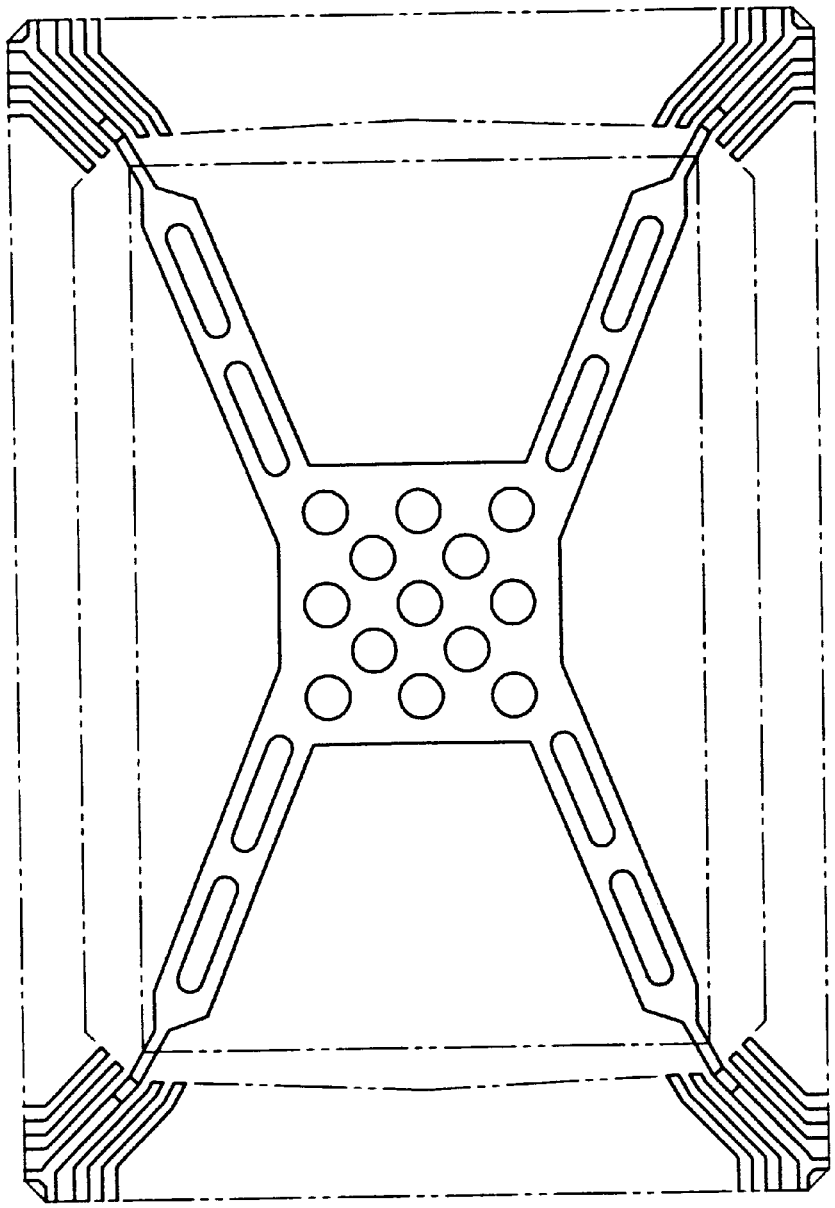
FIG. 22 is a plan view showing the die pad and hanging lead in another conventional lead frame for a semiconductor device.

The frame strength: as shown in Table 1, in semiconductor device in which the semiconductor chips of large, middle and small sizes are mounted on the frame having a die pad shown in FIG. 19, the package camber (PKG camber) does not much depend on a size of the chips, and the frame strength is better than the semiconductor device in which the semiconductor chips of large, middle and small sizes are mounted on the frame with a die pad shown in FIG. 21 and on the frame with a die pad without hanging lead reinforcement shown in FIG. 22.

TABLE 1

| Frame | Example (FIG. 19) | | | Conventional Example (FIG. 21) | | | Conventional Example (FIG. 22) | | |
|---|---|---|---|---|---|---|---|---|---|
| Chip Size | Large | Middle | Small | Large | Middle | Small | Large | Middle | Small |
| PKG camber | 40 μm | 28 μm | 33 μm | 80 μm | 60 μm | 35 μm | Chip was exposed at the time of molding. | | |

EXAMPLE 2

In the present example, the lead frame, which is different from Example 1 in that the die pad is a square whose one side is 3 mm, was used, and the semiconductor chip whose dimension is 14 mm×10 mm was used, and the external shape dimension of the mold resin was 20 mm×14 mm×1.4 mm.

Figure 23:
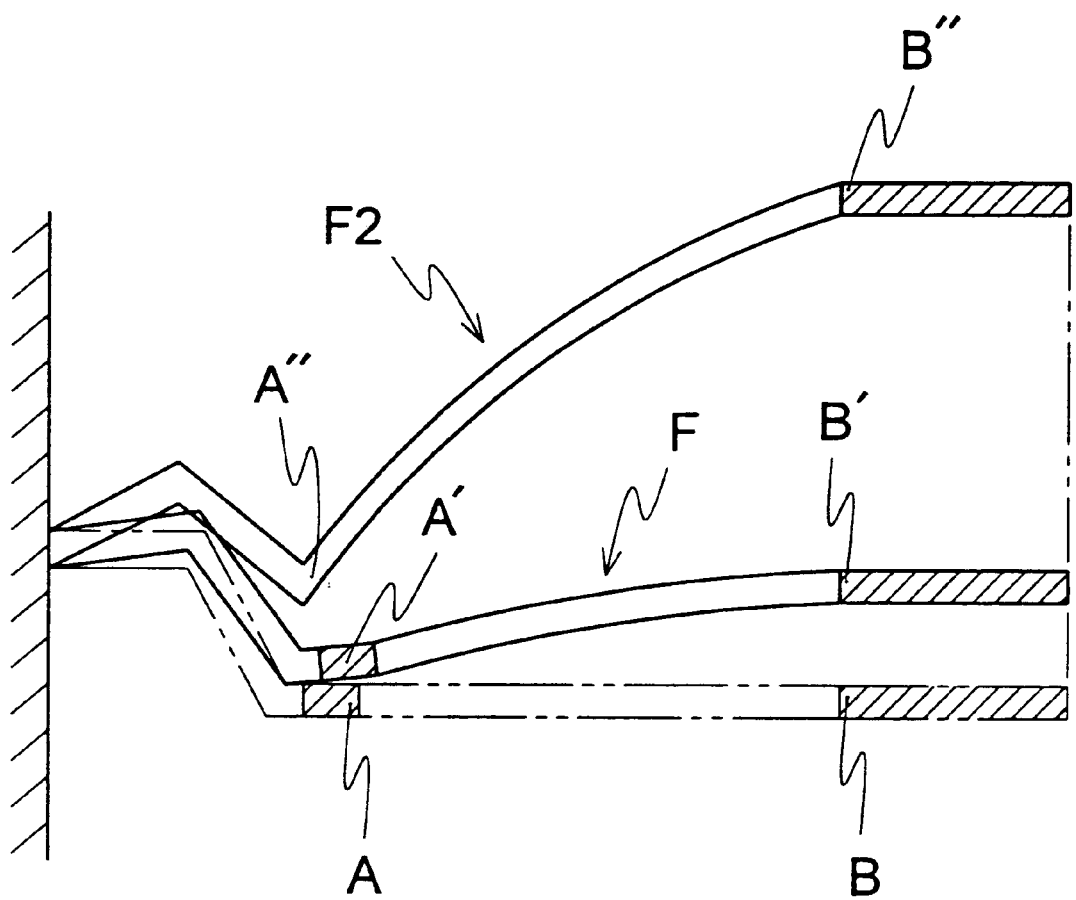
FIG. 23 is an explanatory view showing the die pad shift before and after molding.
Figure 24:
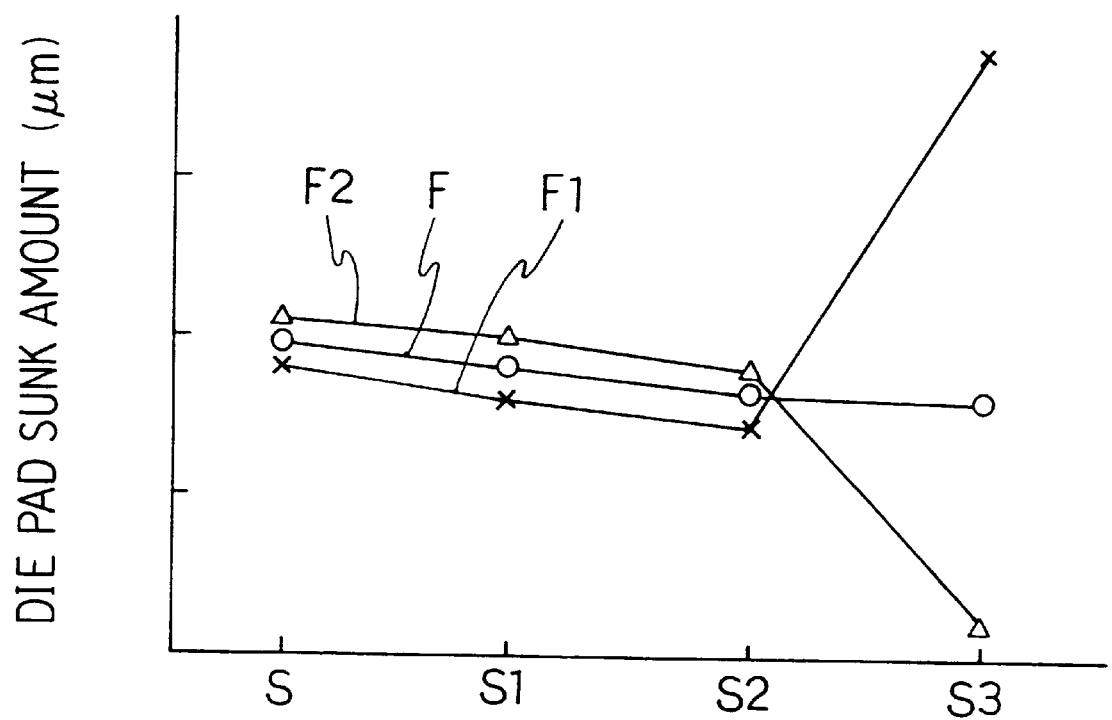
FIG. 24 is a view showing a change in the die pad sunk amount in each processing step of the semiconductor device.

The frame of this example, the frame shown in FIG. 22 in which the small die pad does not have the hanging lead reinforcement, and the frame shown in FIG. 21, which is larger than the semiconductor chip, were used. After the large semiconductor chip was die-bonded to the die pad by the resin die bond material, the electrodes of the semiconductor chip were connected with the corresponding inner end portions of the inner leads by bonding wires and the chip was sealed with molded resin. FIG. 23 shows a difference in a displacement amount between the hanging leads A' and A" and the die pads B' and B" after sealing, relating to the frame F of the present example and the frame F2 shown in FIG. 22. Actual measurements measured by grinding cross sections are shown in Table 2. In Table 2, A and B represent frame corners and die pad corners. However, in the conventional example (FIG. 21), A and B are the same position. FIG. 24 shows the results of measuring a change in a die pad sunk amount before die-bonding (S), after die-bonding (S1), after wire-bonding (S2) and after molding (S3) in the crude frames F, F1 and F2. According to the results, it was confirmed that when a molten resin is poured into the metal mold, a displacement of the hanging lead and die pad shift which are caused by an imbalance of the pouring of resin can be suppressed by the frame reinforcement shown in FIG. 19 in the conventional small die pad frame having a long hanging lead shown in FIG. 22. In the frame F1 shown in FIG. 21, the die pad was exposed after molding. Here, die pad shift amount is changed greatly according to the position of the reinforcement at the time of molding.

TABLE 2

| Frame | Crude Frame | | After Die-Bonding | | After Wire-Bonding | | After Molding | |
|---|---|---|---|---|---|---|---|---|
| | A | B | A | B | A | B | A | B |
| Example 2 (FIG. 19) | 237.7 | 246.6 | 232.3 | 226.2 | 220.4 | 185.7 | 206.2 | 177.7 |
| Conventional Example (FIG. 22) | 240.2 | 250.7 | 232.3 | 230.8 | 221.2 | 189.2 | 180.0 | 70.0 |
| Conventional Example (FIG. 21) | 243.0 | — | 224 | — | 212.9 | — | Die pad was exposed | Die pad was exposed |

As mentioned above, according to the present invention, one side of the semiconductor chip is 2.5 mm smaller than the one side of the mold external diameter, one side of the most external circumference of the hanging lead reinforcement formed in the frame shape is not more than a length of one side of the semiconductor chip, one side of the die pad exceeds 3 mm and is not more than 50% of the length of one side of the external circumference of the hanging lead reinforcement formed in a frame shape, the die pad is sunk in the vicinity where the second hanging lead for connecting the hanging lead reinforcement with the dam bar is connected with the hanging lead reinforcement, and a step is provided to the second hanging lead. According to the invention in claim 5, the first hanging lead has a width larger than the width of the second hanging lead, the die pad is sunk in the vicinity where the second hanging lead is connected with the hanging lead reinforcement, and a step, which is at least ½ of a value obtained by subtracting a thickness dimension of the semiconductor chip, a thickness dimension of the die-bonding and a thickness dimension of the die pad from a mold thickness dimension, is provided to the second hanging lead. According to the invention in claim 6, the first hanging lead has a width larger than the width of the second hanging lead, the die pad is sunk in the vicinity where the second hanging lead is connected with the hanging lead reinforcement, and a step is provided to the second hanging lead. Therefore, in the semiconductor device assembling process, namely, in the die-bonding step for fixing and holding the semiconductor chip to the die pad, the wire-bonding step for connecting the electrodes provided on the semiconductor chip with plural inner leads by using the metal wire, and in the molding step for sealing the semiconductor chip, die pad and plural inner leads with a prescribed external dimension with resin, the position of the die pad in the longitudinal direction before the die-bonding step can be maintained without shifting the die pad in the upward and downward. For this reason, the yield of the semiconductor device assembling process is improved, and the stress balance of the semiconductor device in the longitudinal direction becomes uniform, so that the camber of the external shape of the semiconductor device can be reduced and prevented. In addition, since in the reliability test on the semiconductor device, particularly the moisture absorption crack resistance can be improved greatly, durability in the practical use of the semiconductor device can be improved. As a result, the semiconductor device with high quality and reliability can be obtained.

According to the invention, the die pad is sunk in the vicinity where the second hanging lead is connected with the hanging lead reinforcement and a step is provided to the second hanging lead. According to the invention, the first hanging lead has a width larger than the width of the second hanging lead, the die pad is sunk in the vicinity where the second hanging lead is connected with the hanging lead reinforcement, a step, which is at least ½ of the value obtained by subtracting the thickness dimension of the semiconductor chip, and the thickness dimension of the die-bonding and the thickness dimension of the die pad from the thickness dimension of the mold, is provided to the second hanging lead. According to the invention, the first hanging lead has a width larger than the width of the second hanging lead, the die pad is sunk in the vicinity where the second hanging lead is connected with the hanging lead reinforcement, and a step is provided to the second hanging lead. Accordingly, the die pad shift can be reduced.

What is claimed is:

1. A semiconductor device comprising:
   a unitary lead frame including:
   a die pad having plural corners;
   plural inner leads arranged at intervals along a circumferential edge of the die pad and having respective inner end portions;
   plural outer leads respectively extending from an outer side of corresponding inner leads;
   a hanging lead reinforcement in a frame shape and located between the die pad and the inner leads along the circumferential edge of the die pad;
   first hanging leads connecting the corners of the die pad with the hanging lead reinforcement; and
   second hanging leads connecting the hanging lead reinforcement with a dam bar located between the inner leads and outer leads;
   a semiconductor chip die bonded to the lead frame; and
   metal wires electrically connecting the semiconductor chip with the plural inner leads, wherein the lead frame, semiconductor chip, and metal wires are encapsulated in a molded resin, and an end portion of the outer leads of the lead frame, the dam bar, and end portions of the second hanging leads at an outer portion, proximate a surface of a mold, are cut, and a length of one side of the semiconductor chip is 2.5 mm smaller than a side of a mold external dimension, one side of the largest dimension of the hanging lead reinforcement does not exceed the length of one side of the semiconductor chip, one side of the die pad exceeds 3 mm in length and is not more than 50% of the length of one side of the largest dimension of the hanging lead reinforcement, the die pad is sunk proximate a location where the second hanging lead connecting the hanging lead reinforcement with the dam bar is connected with the hanging lead reinforcement, and a step is included in the second hanging lead.

2. A unitary lead frame for a semiconductor device comprising:

a die pad having plural corners;

plural inner leads, each inner lead having an inner end portion, a center point of a semiconductor chip coinciding with a center point of the die pad, the inner leads being arranged at intervals along a circumferential edge of the semiconductor chip with a gap therebetween;

a dam bar located on an external extended portion of the inner leads;

plural outer leads extending from the dam bar and having ends connected to a rail portion of the frame;

a hanging lead reinforcement in a frame shape along a circumferential edge of the die pad for reinforcing the die pad, located between the die pad and the inner leads, spaced from and longer than a side of the die pad, coplanar with the die pad, and on which a semiconductor chip may be mounted; and first hanging leads connecting the corners of the die pad with the hanging lead reinforcement, and second hanging leads connecting the hanging lead reinforcement with the dam bar, wherein the die pad is sunk where the second hanging lead is connected with the hanging lead reinforcement, and a step is provided for the second hanging lead.

3. A unitary lead frame for a semiconductor device comprising:

a die pad having plural corners;

plural inner leads, each inner lead having an inner end portion, a center point of a semiconductor chip coinciding with a center point of the die pad, the inner leads being arranged at intervals along a circumferential edge of the semiconductor chip with a gap therebetween;

a dam bar located on an external extended portion of the inner leads;

plural outer leads extending from the dam bar and having ends connected to a rail portion of the frame;

a hanging lead reinforcement in a frame shape along a circumferential edge of the die pad, located between the die pad and the inner leads, and spaced from and longer than a side of the die pad; and first hanging leads connecting the corners of the die pad with the hanging lead reinforcement, and second hanging leads connecting the hanging lead reinforcement with the dam bar, wherein the first hanging leads have a width larger than a width of the second hanging leads, the die pad is sunk where the second hanging leads are connected to the hanging lead reinforcement, and a step having a height at least ½ of the difference obtained by subtracting the sum of semiconductor chip thickness, die bond thickness, and die pad thickness, from the molding resin thickness, is provided in the second hanging leads.

4. A semiconductor device including a semiconductor chip and a unitary lead frame, the lead frame comprising:

a die pad having plural corners;

plural inner leads, each inner lead having an inner end portion, a center point of the semiconductor chip coinciding with a center point of the die pad, the inner leads being arranged at intervals along a circumferential edge of the semiconductor chip with a gap therebetween;

a dam bar located on an external extended portion of the inner leads;

plural outer leads extending from the dam bar and having ends connected to a rail portion of the frame;

a hanging lead reinforcement in a frame shape along a circumferential edge of the die pad for reinforcing the die pad, located between the die pad and the inner leads, spaced from and longer than a side of the die pad, coplanar with the die pad, and on which the semiconductor chip is mounted with a bonding resin; and first hanging leads connecting the corners of the die pad with the hanging lead reinforcement, and second hanging leads connecting the hanging lead reinforcement with the dam bar, wherein the die pad is sunk where the second hanging lead is connected with the hanging lead reinforcement, and a step is located in the second hanging lead.

5. The lead frame of claim 2, wherein the first hanging lead is wider than the second hanging lead.

6. A semiconductor device including a semiconductor chip and a unitary lead frame, the lead frame comprising:

a die pad having plural corners;

plural inner leads, each inner lead having an inner end portion, a center point of the semiconductor chip coinciding with a center point of the die pad, the inner leads being arranged at intervals along a circumferential edge of the semiconductor chip with a gap therebetween;

a dam bar located on an external extended portion of the inner leads;

plural outer leads extending from the dam bar and having ends connected to a rail portion of the frame;

a hanging lead reinforcement in a frame shape along a circumferential edge of the die pad for reinforcing the die pad, located between the die pad and the inner leads, spaced from and longer than a side of the die pad, coplanar with the die pad, and on which the semiconductor chip is mounted with a bonding resin; and first hanging leads connecting the corners of the die pad with the hanging lead reinforcement, and second hanging leads connecting the hanging lead reinforcement with the dam bar, wherein the first hanging lead is wider than the second hanging lead, the die pad is sunk where the second hanging lead is connected with the hanging lead reinforcement at a first step, and a second step is provided in the second hanging lead.

* * * * *